US008304173B2

(12) United States Patent
Yu et al.

(10) Patent No.: US 8,304,173 B2
(45) Date of Patent: Nov. 6, 2012

(54) PHOTOMASKS, METHODS OF EXPOSING A SUBSTRATE TO LIGHT, METHODS OF FORMING A PATTERN, AND METHODS OF MANUFACTURING A SEMICONDUCTOR DEVICE

(75) Inventors: Sang-Yong Yu, Hwaseong-si (KR); Sung-Hyuck Kim, Yongin-si (KR); Gi-Sung Yoon, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 182 days.

(21) Appl. No.: 12/847,274

(22) Filed: Jul. 30, 2010

(65) Prior Publication Data
US 2011/0053096 A1    Mar. 3, 2011

(30) Foreign Application Priority Data

Aug. 25, 2009    (KR) .................. 10-2009-0078533

(51) Int. Cl.
*G03F 7/20*    (2006.01)
(52) U.S. Cl. ........... 430/313; 430/22; 430/396; 430/394
(58) Field of Classification Search .................. 430/394, 430/5, 322, 313, 312, 397
See application file for complete search history.

(56) References Cited

U.S. PATENT DOCUMENTS

| 5,837,426 A | 11/1998 | Tseng et al. |
| 6,924,083 B2 * | 8/2005 | Huang et al. ............... 430/296 |
| 2008/0081412 A1 * | 4/2008 | Jung ........................... 438/257 |

FOREIGN PATENT DOCUMENTS

| KR | 1996-0005808 A | 2/1996 |
| KR | 10-2005-0066169 A | 6/2005 |
| KR | 10-2006-0135156 A | 12/2006 |

OTHER PUBLICATIONS

Korean Machine Translation, Yu, KR10-2006-0135156, Dec. 29, 2006.*

* cited by examiner

*Primary Examiner* — Kathleen Duda
*Assistant Examiner* — Caleen Sullivan
(74) *Attorney, Agent, or Firm* — Lee & Morse, P.C.

(57) ABSTRACT

The method of forming a pattern includes forming a first photosensitive layer pattern including a first pattern in a first region of a substrate and a second pattern in a second region of the substrate, by performing a first photolithography process using a photomask having a first mask region and a second mask region. The first pattern is transferred from the first mask region, and the second pattern is transferred from the second mask region. The method further includes forming a second photosensitive layer pattern including a third pattern in the second region of the substrate and a fourth pattern in the first region of the substrate, by performing a second photolithography process using the photomask. The third pattern is transferred from the first mask region, and the fourth pattern is transferred from the second mask region.

10 Claims, 19 Drawing Sheets

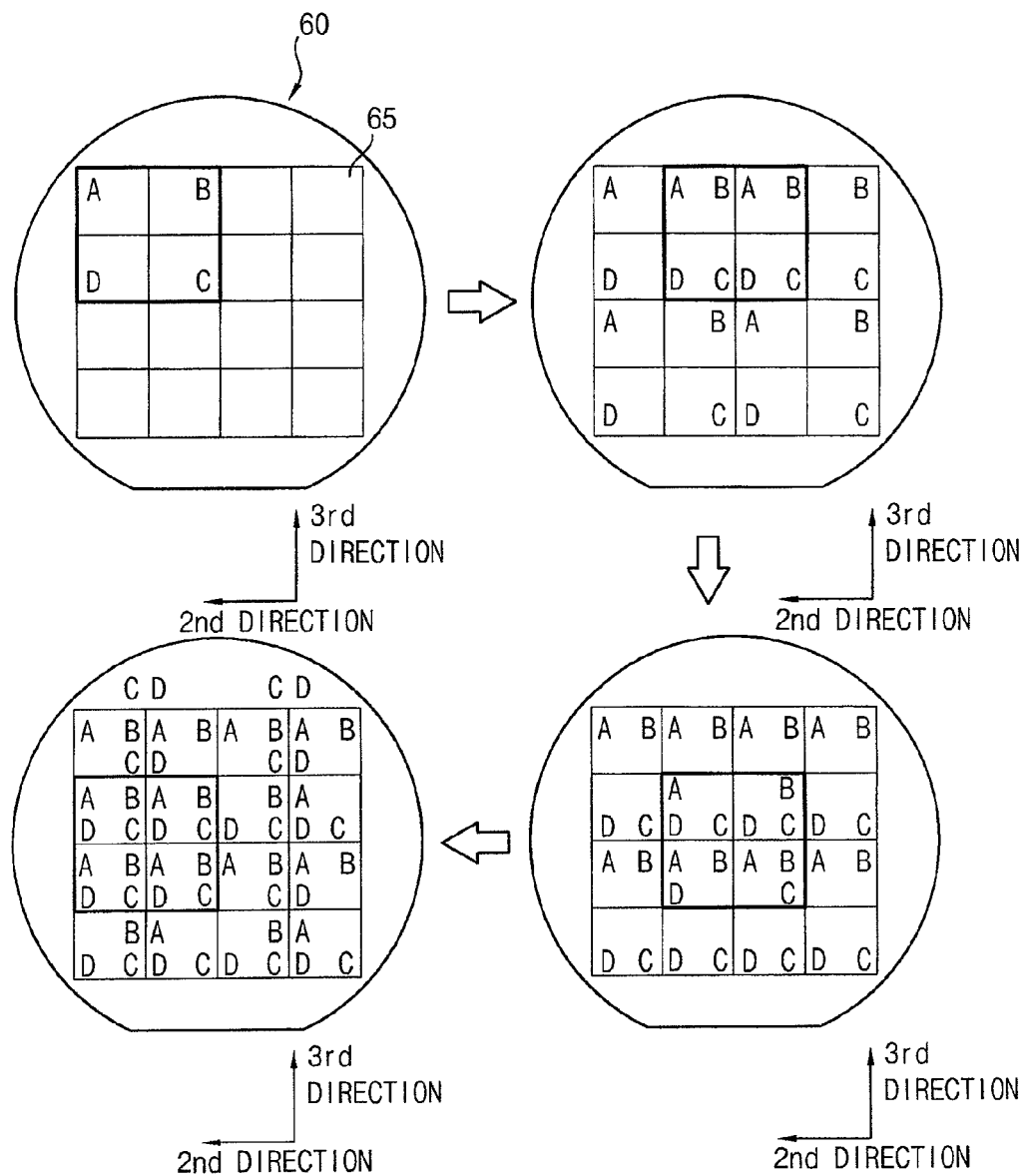

2nd DIRECTION

2nd DIRECTION

2nd DIRECTION

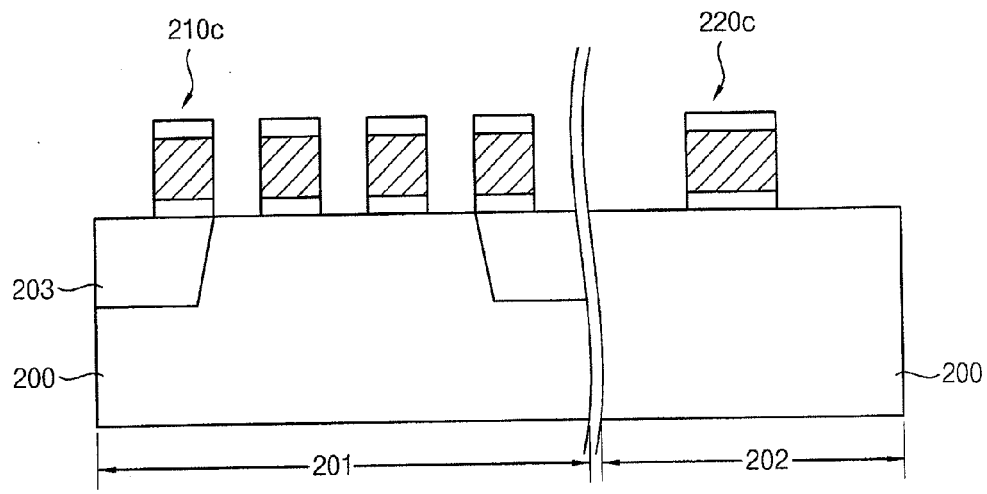
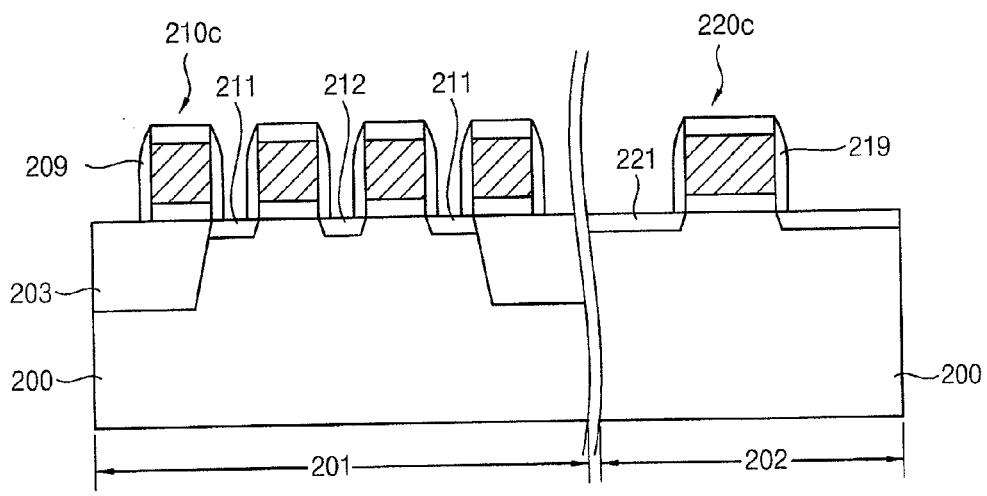

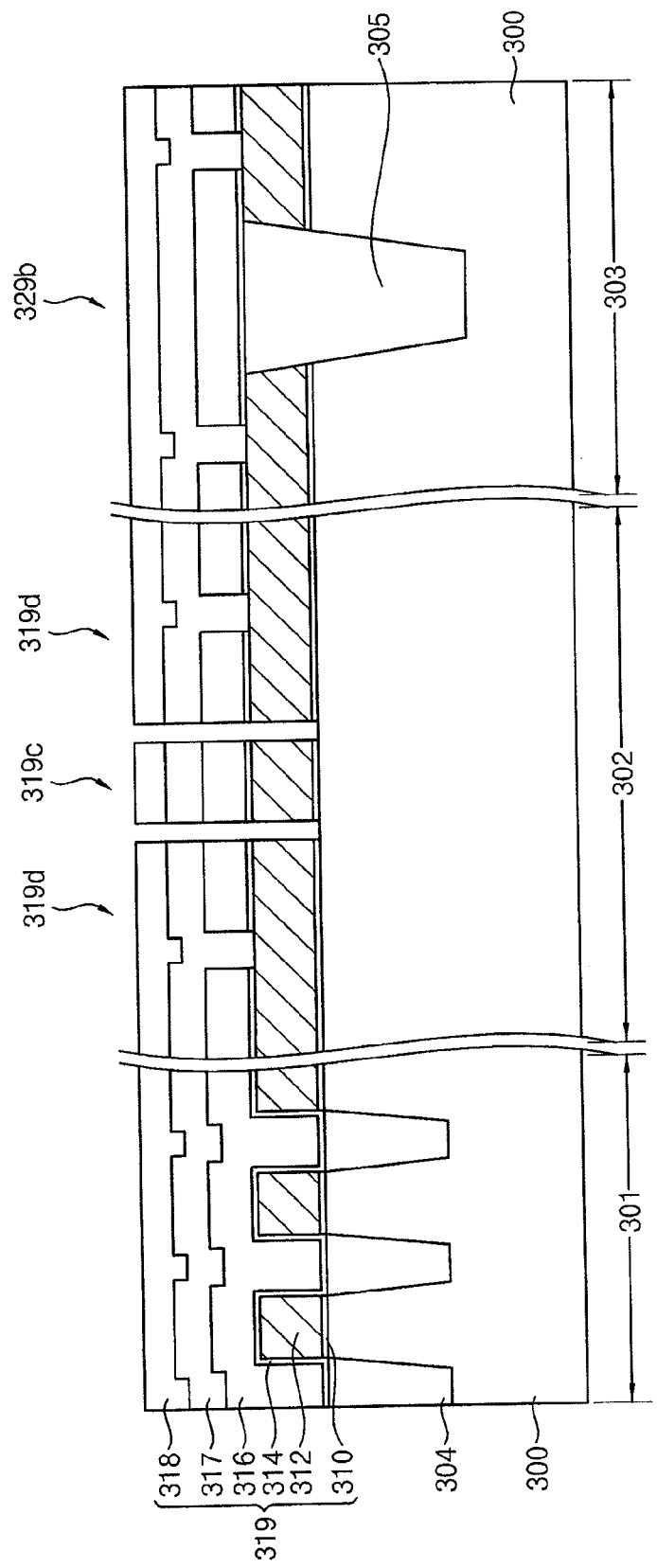

PHOTOMASKS, METHODS OF EXPOSING A SUBSTRATE TO LIGHT, METHODS OF FORMING A PATTERN, AND METHODS OF MANUFACTURING A SEMICONDUCTOR DEVICE

BACKGROUND

1. Field

Example embodiments relate to photomasks, methods of exposing a substrate to light, methods of forming a pattern, and methods of manufacturing a semiconductor device.

2. Description of the Related Art

A single patterning method includes a method of forming a pattern of an integrated circuit (IC) by performing an exposure process once. In the single patterning method, a pattern having a uniform line width may be easily formed because the exposure process may be performed using the same exposure mask under the same conditions. An apparatus used for the exposure process, however, may have a limited resolution so that a line width of a pattern may not be sufficiently reduced in the single patterning method.

A double patterning method and a multi-patterning method may be used for overcoming the problems of the single patterning method. The double patterning method may include a method of forming a fine pattern of an integrated circuit (IC) by performing an exposure process twice. A minimum pitch of the pattern may be reduced by half in the double patterning method when compared to the single patterning method. Thus, the double patterning method may be effectively applied to manufacturing a semiconductor device having a critical dimension (CD) less than about 50 nm.

The multi-patterning method may include performing an exposure process more than two times. The multi-patterning method may also reduce a minimum pitch of the pattern when compared to the single pattern method.

In the double patterning method and the multi-patterning method, an each exposure process may be performed using different masks. When the masks are replaced with each other, however, misalignments between the masks may occur.

SUMMARY

Embodiments are therefore directed to photomasks, methods of exposing a substrate to light using the photomasks, methods of forming patterns using the photomasks, and methods of manufacturing a semiconductor device using the photomasks, which substantially overcome one or more of the problems due to the limitations and disadvantages of the related art.

It is therefore a feature of an embodiment to provide a method of forming a pattern that includes using a photomask to form first and second photosensitive layer patterns.

It is therefore another feature of an embodiment to provide a method of forming a pattern that includes using a photomask to form n photosensitive layer patterns.

At least one of the above and other features and advantages may be realized by providing a method of forming a pattern that includes sequentially forming an object layer and a first photosensitive layer on a substrate including a first region and a second region. A first photosensitive layer pattern including a first pattern in the first region and a second pattern in the second region is formed by performing a first photolithography process using a photomask. The photomask has a first mask region and a second mask region. The first pattern is transferred from the first mask region, and the second pattern is transferred from the second mask region. A first etching process is performed on the object layer using the first photosensitive layer pattern as an etching mask to form a first object layer pattern. A second photosensitive layer is formed on the substrate to cover the first object layer pattern. A second photosensitive layer pattern including a third pattern in the second region and a fourth pattern in the first region is formed by performing a second photolithography process using the photomask. The third pattern is transferred from the first mask region, and the fourth pattern is transferred from the second mask region. A second etching process is performed on the first object layer pattern using the second photosensitive layer pattern as an etching mask to form a second object layer pattern.

The first region of the substrate and the second region of the substrate may include at least one chip region, and the first and second regions may be arranged side by side in a first direction or in a second direction perpendicular to the first direction. A portion of the second pattern of the first photosensitive layer pattern may not overlap the third pattern of the second photosensitive layer pattern.

The photomask may be aligned with the substrate after forming the second photosensitive layer so that the first mask region overlaps the second region and the second mask region overlaps the first region. The first mask region and the second mask region may define a pattern in a cell region of a semiconductor device, and at least one of the first mask region and the second mask region may define a pattern in a peripheral region of the semiconductor device. A word line or a bit line may include the pattern of the cell region. The first mask region and the second mask region may define patterns extending in the same direction, and the first and second mask regions may be exposed to light simultaneously by a single source of light.

At least one of the above and other features and advantages may also be realized by providing a method of forming a pattern that includes (a) forming an object layer on a substrate including a plurality of chip regions. (b) forming a photosensitive layer on the object layer. (c) forming a photosensitive layer pattern by performing a photo-developing process using a photomask. The photomask includes n mask regions (n is an even number). The n mask regions define n divided patterns from a desired pattern of one of the chip regions, respectively, and each n mask region corresponds to at least one of the chip regions. (d) forming an object layer pattern by performing an etching process using the photosensitive layer pattern as an etching mask. (e) The steps of (b) to (d) are repeated n times. The step (c) further includes aligning the photomask with the substrate so that all the n divided patterns are transferred from the n masks regions to each of the chip regions once while the steps of (b) to (d) are repeated n times.

The step (c) may further include exposing the entire photosensitive layer to light by repeatedly shifting the substrate by a single shot width. The method may further include (f) removing the photosensitive layer pattern from the substrate after forming the object layer pattern, and the steps (b) to (f) are performed n times.

Embodiments provide photomasks that, e.g., may improve a resolution of patterns and may improve a reliability of an exposure process. Embodiments provide methods of exposing a substrate to light using the photomask. Embodiments provide methods of forming a pattern using the methods of exposing a substrate to light. Embodiments provide methods of manufacturing a semiconductor device using methods of forming a pattern.

BRIEF DESCRIPTION OF THE DRAWINGS

The above and other features and advantages will become more apparent to those of ordinary skill in the art by describing in detail exemplary embodiments with reference to the attached drawings, in which:

FIGS. 6A to 6B illustrate wafer maps of a method of exposing chip regions on the substrate to light using the photomasks illustrated in respective FIGS. 5a and 5b;

FIGS. 9 to 13 illustrate cross-sectional views of a method of manufacturing a semiconductor memory device according to an exemplary embodiment;

DETAILED DESCRIPTION

Korean Patent Application No. 2009-0078533, filed on Aug. 25, 2009, in the Korean Intellectual Property Office, and entitled: "Photomasks, Methods of Exposing a Substrate to Light, Methods of Forming a Pattern, and Methods of Manufacturing a Semiconductor Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

Figure 1:
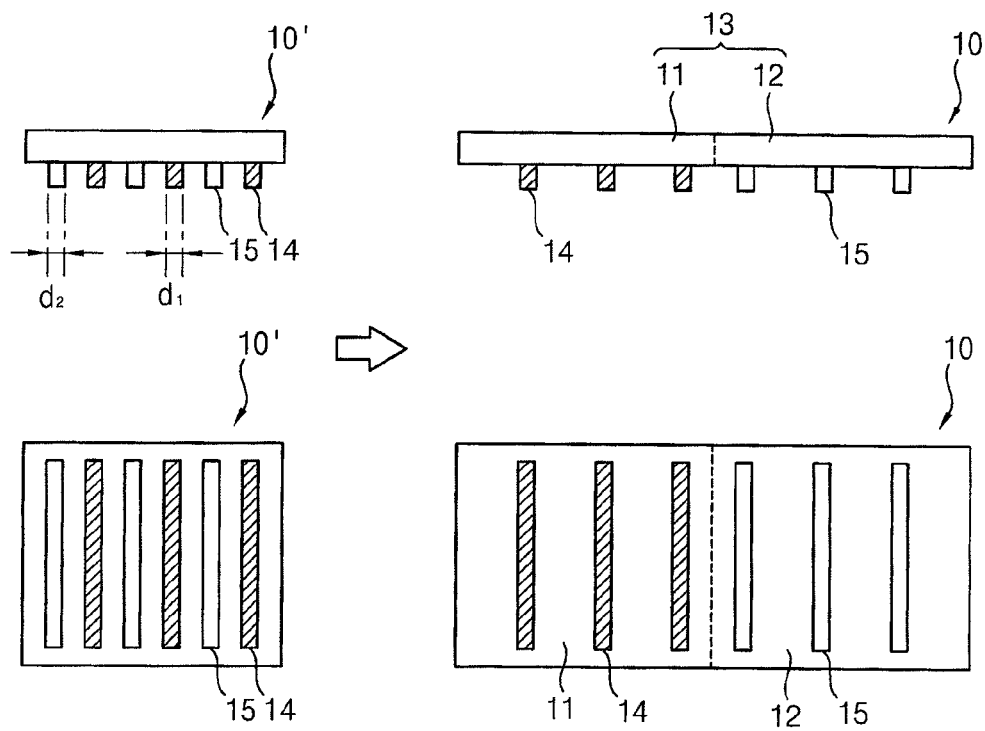
FIGS. 1 and 2 illustrate cross-sectional views of photomasks according to exemplary embodiments.

FIG. 1 illustrates a cross-sectional view and a top view of a first photomask in accordance with example embodiments.

Referring to FIG. 1, a first photomask 10 may include a first transparent substrate 13, a first mask pattern 14, and a second mask pattern 15. The first transparent substrate 13 may include a first mask region 11 and a second mask region 12. The first and second mask patterns 14 and 15 may be formed on the first and second mask regions 11 and 12 of the first transparent substrate 13, respectively.

In the case that the first photomask 10 is physically separated into the first mask region 11 and the second mask region 12, and the first and second mask regions 11 and 12 are moved to overlap each other, the first and second mask patterns 14 and 15 may not overlap each other. The first mask pattern 14 may be a portion of a first desired pattern and the second mask pattern 15 may be another portion of the first desired pattern. The first desired pattern may be transferred to an object layer by transferring the first and second mask patterns 14 and 15 sequentially onto the object layer. Transferring may refer to moving a desired pattern defined by a photomask to a photosensitive layer on the object by, e.g., light irradiation.

The first and second mask regions 11 and 12 may be arranged side by side on the first photomask 10. In an exemplary embodiment, the first and second mask regions 11 and 12 may correspond to at least one chip region of a substrate. For example, when two chip regions are exposed to light by a single shot of light, the first mask pattern 14 may define patterns of one chip region and the second mask pattern 15 may define patterns of an adjacent chip region. In another exemplary embodiment, the first and second mask patterns 14 and 15 may define patterns on one chip region.

The first and second mask patterns 14 and 15 may include a light-blocking material, e.g., a chrome material, a chrome-like material, etc. The transparent substrate 13 may include a transparent material, e.g., an amorphous silica, a fused quartz, etc.

When a photomask 10' having patterns very close to each other is used, a photolithography process may not be performed efficiently due to a resolution limitation of an exposure process. However, the patterns on photomask 10' may be divided into at least two groups, and the groups may be formed on the first and second mask regions 11 and 12 of the first photomask 10, respectively. Therefore, the patterns in each group may be arranged more distant from each other. As such, the photolithography process may be performed more efficiently using the first photomask 10 as compared to the photomask 10'.

The first mask pattern 14 may have a first width d1, and the second mask pattern 15 may have a second width d2. In an exemplary embodiment, the first width d1 may be substantially the same as the second width d2.

According to an exemplary embodiment when the first and second mask patterns 14 and 15 are transferred to, e.g., one chip region, the first mask pattern 14 may be transferred to a chip region by a first exposure process, and the second mask pattern 15 may be transferred to the chip region by a second exposure process. Thereby, patterns having, e.g., the same width, and being close to each other may be efficiently formed in the chip region. The second mask pattern 15 may be transferred to the chip region before the first mask pattern 14 is transferred to the chip region.

As shown in FIG. 1, the first and second mask patterns 14 and 15 on the first and second mask regions 11 and 12 may extend in the same direction, and be arranged adjacent to each other. Thus, an exposure process for a plurality of chip regions may be efficiently performed using the first photomask 10, and the chip regions may be exposed by a single light source The first photomask 10 may include more than two divided regions, e.g., four divided regions. According to an exemplary embodiment, the first photomask 10 may be divided, e.g., equally, into four regions having different patterns thereon. For example, four linear mask patterns may be formed on the four respective regions of the first photomask 10, e.g., two first linear patterns extending in the first direction may be formed on first and second regions, respectively, and two second linear patterns extending in a second direction perpendicular to the first direction may be formed on third and fourth regions, respectively. The first linear patterns on the first and second regions may have the same length and may not overlap if the first and second regions are physically separated and moved to overlap each other. Similarly, the second linear patterns on the third and fourth regions may have the same length and may not overlap if the third and fourth regions are physically separated and moved to overlap each other. Island shaped images may be transferred from the first photomask 10 to an object layer by controlling the intensity of light so that a portion of the object layer exposed to light twice may be patterned. That is, the object layer may be exposed using the first linear patterns in a first exposure process, and may be exposed again using the second linear patterns in a second exposure process. Island shaped images may be formed at cross-points of the first and second linear patterns in an object layer.

Figure 2:
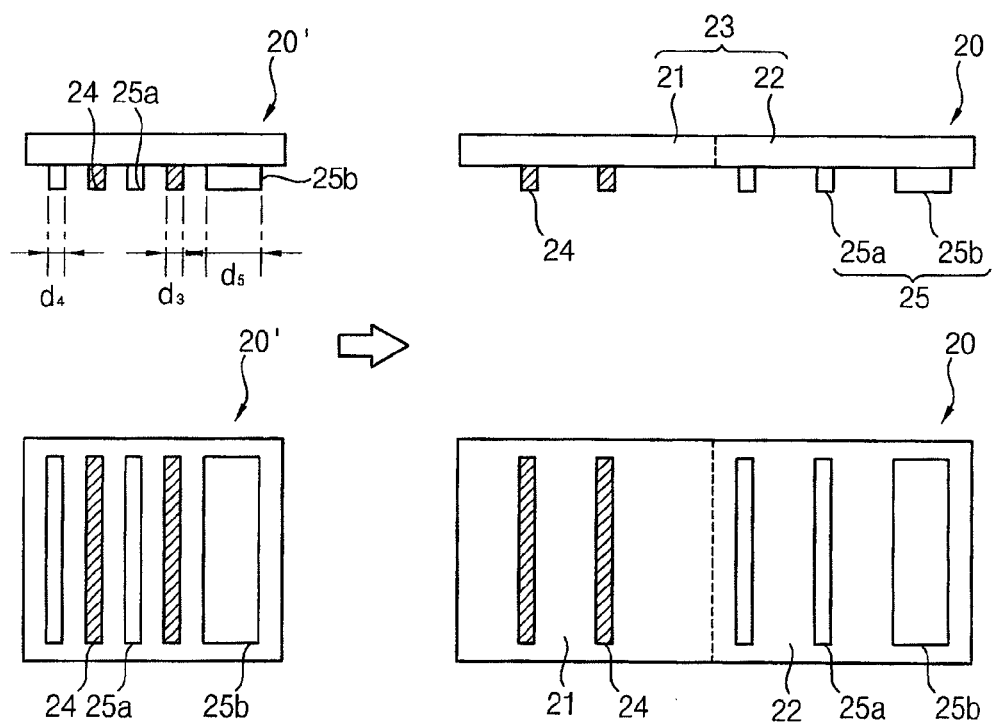

FIG. 2 illustrates a cross-sectional view and a top view of a second photomask in accordance with example embodiments. The second photomask may be substantially the same as or similar to the first photomask of FIG. 1, and the width of the patterns thereof may vary. Thus, detailed and/or repetitive explanations are omitted herein.

Referring to FIG. 2, a second photomask 20 may include a second transparent substrate 23, a third mask pattern 24, and a fourth mask pattern 25. The second transparent substrate 23 may include a third mask region 21 and a fourth mask region 22. The third and fourth mask patterns 24 and 25 may be formed on the third and fourth mask regions 21 and 22 of the second transparent substrate 23, respectively.

In the case that the second photomask 20 is physically separated into the third mask region 21 and the fourth mask region 22, and the third and fourth mask regions 21 and 22 are moved to overlap each other, the third and fourth mask patterns 24 and 25 may not overlap each other. The third mask pattern 24 may be a portion of a second desired pattern and the fourth mask pattern 25 may be another portion of the second desired pattern. The second desired pattern may be transferred to an object layer by transferring the third and fourth mask patterns 24 and 25 sequentially onto the object layer.

The third and fourth mask regions 21 and 22 may be arranged side by side. In an exemplary embodiment, the third and fourth mask regions 21 and 22 may correspond to at least one chip region of a substrate. For example, when two chip regions are exposed to light by a single shot of light, the third mask pattern 24 may define patterns of one chip region and the fourth mask pattern 25 may define patterns of another adjacent chip region. In another exemplary embodiment, the third and fourth mask patterns 24 and 25 may define patterns on one chip region.

The third and fourth mask patterns 24 and 25 may include a light-blocking material, e.g., a chrome material, a chrome-like material, etc. The transparent substrate 23 may include a transparent material, e.g., an amorphous silica, a fused quartz, etc.

When a photomask 20' having patterns very close to each other is used, a photolithography process may not be performed efficiently due to a resolution limitation of an exposure process. However, the patterns on the photomask 20' may be divided into at least two groups, and the groups may be formed on the third and fourth mask regions 21 and 22 of the second photomask 20, respectively. Therefore, the patterns in each group may be arranged more distant from each other. As such, the photolithography process may be performed more efficiently using the second photomask 20 as compared to the photomask 20'.

The third mask pattern 24 may have a third width d3, and first and second portions of the fourth mask pattern 25 may have fourth and fifth widths d4 and d5, respectively. In an exemplary embodiment, the third and fourth widths d3 and d4 may be substantially the same as each other, and the third and fifth width d3 and d5 may be different from each other.

According to an exemplary embodiment when the third and fourth mask patterns 24 and 25 are transferred to, e.g., one chip region, the third mask pattern 24 may be transferred to a chip region by a first exposure process, and the fourth mask pattern 25 may be transferred to the chip region by a second exposure process. Thereby, patterns having, e.g., various widths, and being close to each other may be efficiently formed in the chip region. The fourth mask pattern 25 may be transferred to a chip region before the third mask pattern 24 is transferred to the chip region.

In an exemplary embodiment, the substrate 100 may include a plurality of chip regions. For example, the first and second regions 101 and 102 may include at least one chip region, e.g., each of the first and second regions 101 and 102 may include one, two, three, or four chip regions. The first and second regions 101 and 102 may include the same number of chip regions. When the first and second mask regions 11 and 12 of the first photomask 10 correspond to chip regions of the substrate 100, the first photomask 10 may be easily aligned with the substrate 100 using an alignment mark of the chip region.

Figure 3A:
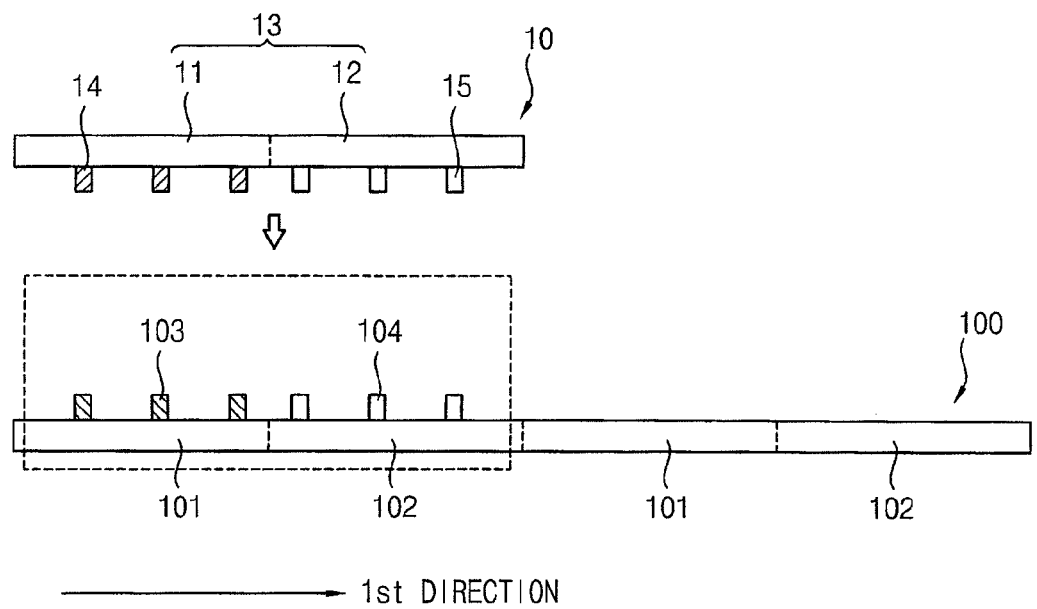
FIGS. 3A to 3C illustrate cross-sectional views of a method of exposing a substrate to light according to exemplary embodiments.
Figure 3B:
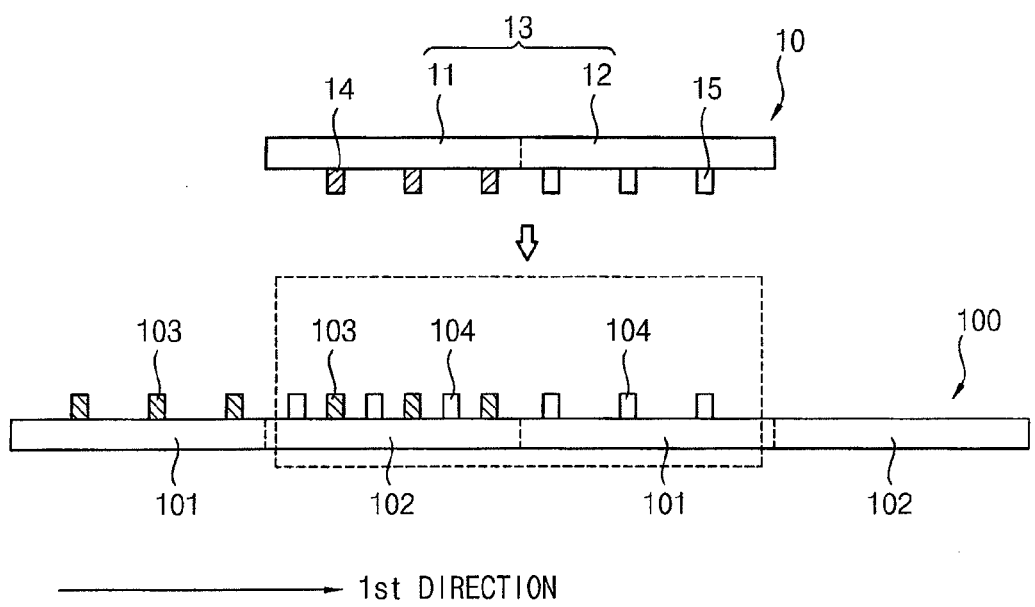
Figure 3C:
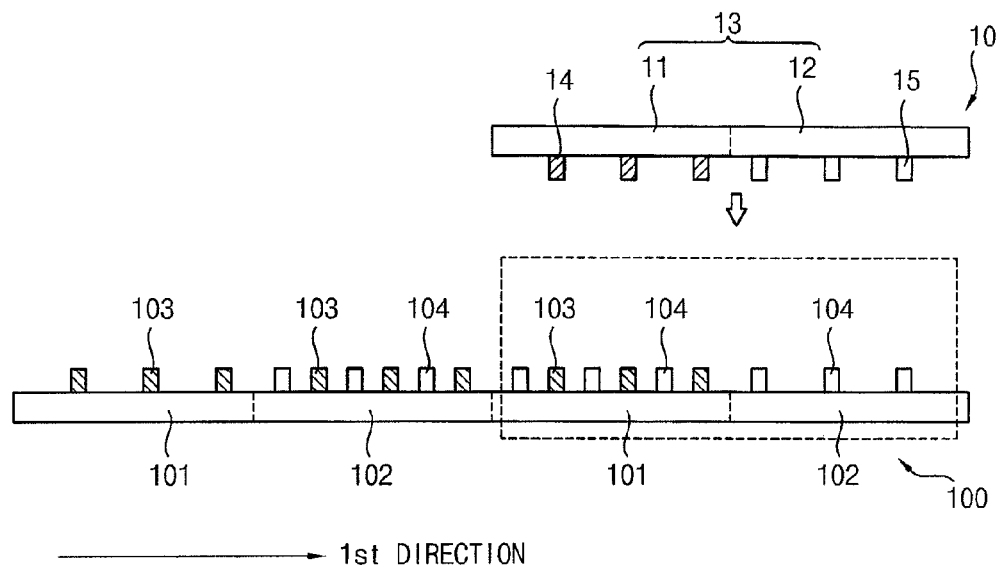

FIGS. 3A to 3C illustrate cross-sectional views of a method of exposing a substrate to light in accordance with example embodiments. Hereinafter, the method of exposing the substrate to light is illustrated using the first photomask 10 of FIG. 1; however, the scope of the embodiments is not limited thereto. For example, the second photomask 20 of FIG. 2 or other kinds of photomasks may be also used for the method of exposing the substrate to light.

Referring to FIG. 3A, the first photomask 10 may be aligned with a substrate 100 having a plurality of first regions 101 and second regions 102, which may each have substantially the same size, e.g., the same width in a first direction. The first and second regions 101 and 102 may be alternately arranged. In an exemplary embodiment, the first photomask 10 may be aligned so that the first mask region 11 and the second mask region 12 may overlap the first region 101 and the second region 102 of the substrate 100, respectively. The first and second mask patterns 14 and 15 may be transferred to the first and second regions 101 and 102, respectively, by performing a first exposure process. Thus, a first pattern 103 may be formed on the first region 101 and a second pattern 104 may be formed on the second region 102.

Referring to FIG. 3B, the first photomask 10 and/or a stage (not shown) supporting the substrate 100, may be shifted in the first direction and/or in the reverse direction of the first direction to align the first photomask 10 again. The photomask 10 may be shifted by half of a single shot width, e.g., by the width of the first region 101. Thus, the substrate 100 and the first photomask 10 may be realigned so that the first mask region 11 of the first photomask 10 may overlap the second region 102 of the substrate 100 on which the second pattern 104 has already been transferred in the first exposure process, and the second mask region 12 may overlap the first region 101 of the substrate 100 that has not been exposed to light in the first exposure process.

The first mask pattern 14 may be transferred to the second region 102 on which the second pattern 104 has already been transferred in the first exposure process, and the second mask pattern 15 may be transferred to the first region 101 that has not been exposed in the first exposure process, i.e., the first region 101 in front of the second region 102 in the first direction by performing a second exposure process. Accordingly, the first pattern 103 may be formed on the second region 102 in addition to the second pattern 104 formed by the first exposure process, and the second pattern 104 may be formed on the first region 101 that is exposed to light in the second exposure process.

Referring to FIG. 3C, the first photomask 10 and/or the stage supporting the substrate 100 may be shifted again in the first direction and/or in the reverse direction of the first direction to align the first photomask 10 again. The first photomask 10 may be shifted by half of a single shot width, e.g., by the width of the first region 101. Thus, the first mask region 11 of the first photomask 10 may be realigned so that the first mask region 11 may overlap the first region 101 on which the second pattern 104 has been transferred in the second exposure process, and the second mask region 12 may overlap the second region 102 that has not been exposed to light in the first or second exposure processes.

The first mask pattern 14 may be transferred to the first region 101 on which the second pattern 104 has already been transferred in the second exposure process, and the second mask pattern 15 may be transferred to the second region 102 that has not been exposed to light in the first or second exposure process, i.e., the second region 102 in front of the first region 101 in the first direction by performing a third exposure process. Accordingly, the first pattern 103 may be formed on the first region 101 in addition to the second pattern 104 formed by the second exposure process, and the second pattern 104 may be formed on the second region 102 that is exposed to light in the third exposure process.

Figure 4A:
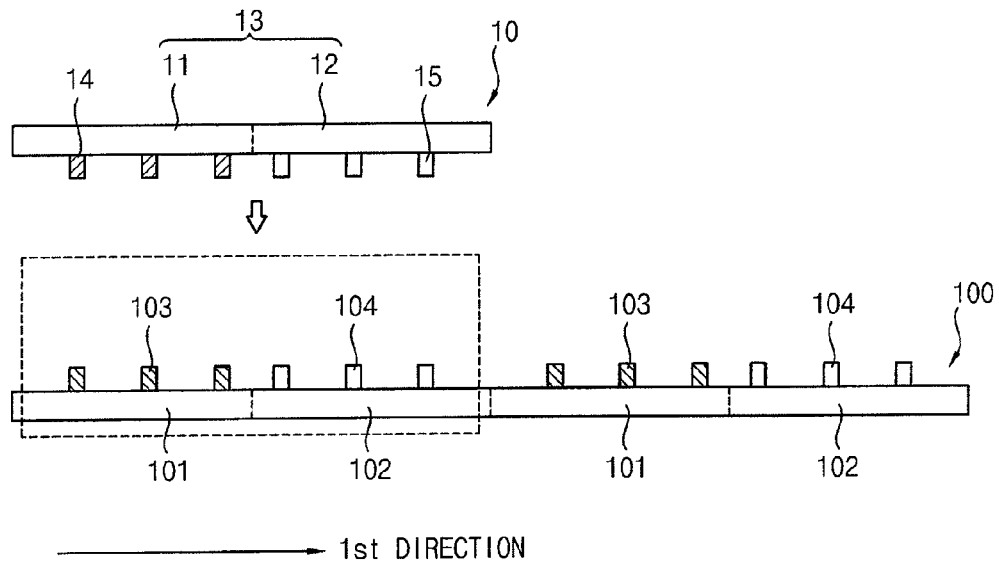
FIGS. 4A to 4B illustrate cross-sectional views of a method of exposing a substrate to light according to exemplary embodiments.
Figure 4B:
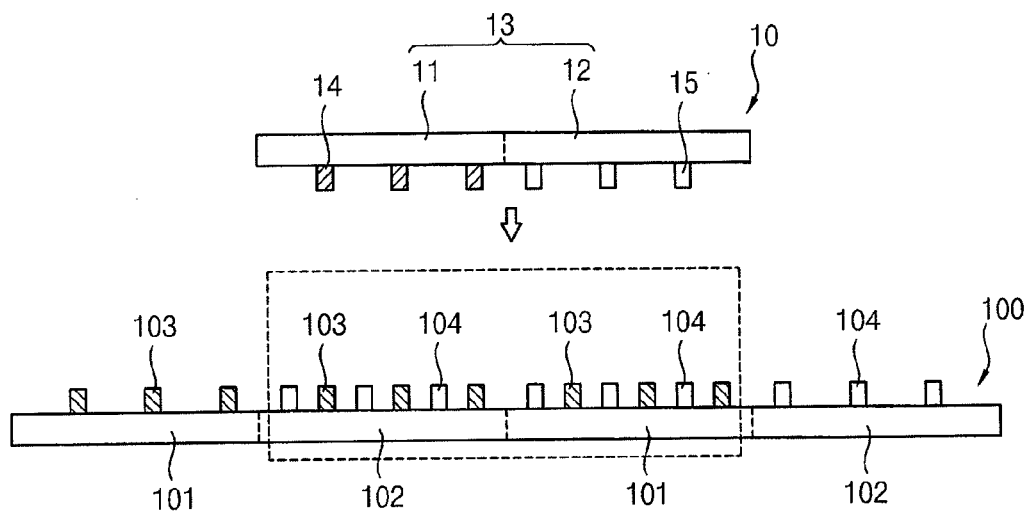

FIGS. 4A and 4B illustrate cross-sectional views of a method of exposing a substrate to light in accordance with example embodiments. Hereinafter, the method of exposing the substrate to light is illustrated using the first photomask 10 of FIG. 1; however, the scope of the embodiments is not limited thereto.

Referring to FIG. 4A, the first photomask 10 may be aligned with the substrate 100 having a plurality of first regions 101 and the second regions 102, which may each having substantially the same size, e.g., the same width in a first direction. The first and second regions 101 and 102 may be alternately arranged. In an exemplary embodiment, the first photomask 10 may be aligned so that the first mask region 11 and the second mask region 12 may overlap the first region 101 and the second region 102 of the substrate 100, respectively, by performing a first exposure process. Thus, the first pattern 103 may be formed on the first region 101 and the second pattern 104 may be formed on the second region 102.

The first exposure process may be performed repeatedly on the first region 101 and second region 102 that have not been exposed to light. Particularly, the first photomask 10 and/or the stage supporting the substrate 100 may be shifted by a single shot width, e.g., by the widths of the first region 101 and the second region 102. Thus, the first and second mask patterns 14 and 15 may be transferred to the first and the respective second regions 101 and 102 that have not been exposed to light.

Referring to FIG. 4B, the first photomask 10 and/or a stage supporting the substrate 100 may be shifted in the first direction and/or in the reverse direction of the first direction to align the first photomask 10 again. The photomask may be shifted by half of a single shot width, e.g., by the width of the first region 101. Thus, the substrate 100 and the first photomask 10 may be realigned so that the first mask region 11 of the first photomask 10 may overlap the second region 102 of the substrate 100 on which the second pattern 104 has already been transferred in the first exposure process, and the second mask region 12 may overlap the first region 101 of the substrate 100 that the first pattern 103 has already been transferred in the first exposure process.

The first mask pattern 14 may be transferred to the second region 102 on which the second pattern 104 has already been transferred in the first exposure process, and the second mask pattern 15 may be transferred to the first region 101 on which the first pattern 103 has already been transferred in the first exposure process, i.e., the first region 101 in front of the second region 102 in the first direction by performing a second exposure process. Accordingly, the first pattern 103 may be formed on the second region 102 in addition to the second pattern 104 formed by the first exposure process, and the second pattern 104 may be formed on the first region 101 in addition to the first pattern 103 formed by the first exposure process by performing the second exposure process.

The second exposure process may be performed repeatedly on other regions on which the first exposure process has been performed only. The first and the second patterns 103 and 104 may be formed on the second and the first regions 102 and 101, respectively, by repeating the second exposure process and shifting the first photomask 10 and/or the stage supporting the substrate 100 by a single shot width, e.g., by the widths of at least one of the first region 101 and the second region 102. As a result, each of the first and second regions 101 and 102 may include both of the first and the second patterns 103 and 104.

Figure 5A:
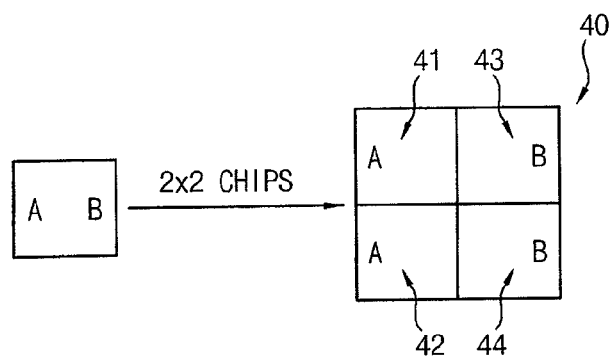
FIGS. 5A to 5B illustrate block diagrams of photomasks including divided pattern regions according to exemplary embodiments.
Figure 5B:
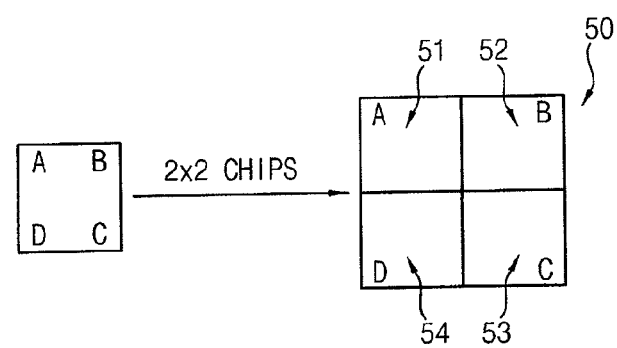
Figure 6A:
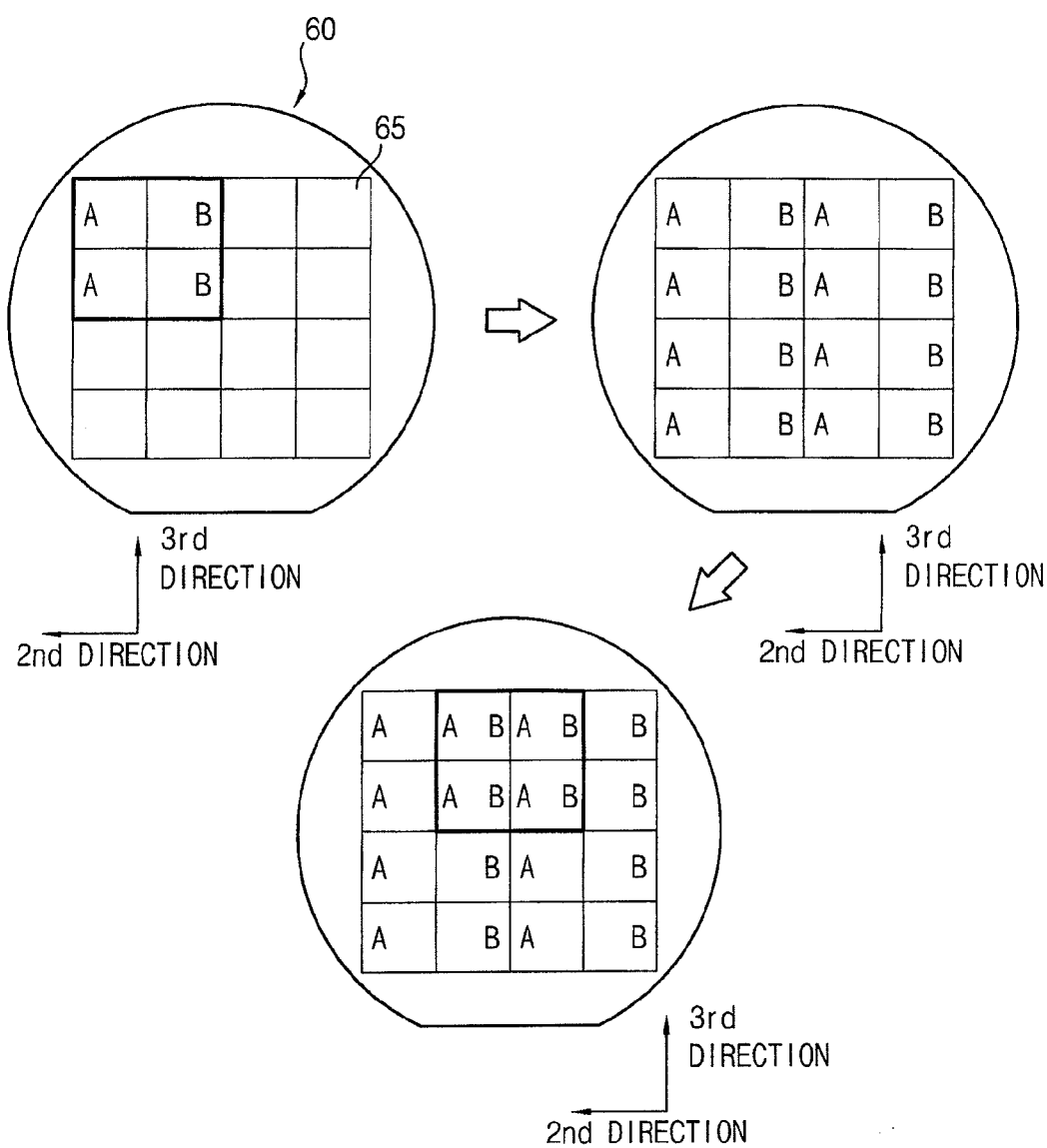

FIGS. 5A and 5B illustrate block diagrams of photomasks including divided mask regions in accordance with example embodiments. FIGS. 6A and 6B illustrate wafer maps of a method of exposing chip regions of a substrate to light using the photomasks and mask regions illustrated in FIGS. 5A and 5B.

Referring to 5A, a third photomask 40 may include divided, e.g., equally divided, first, second, third, and fourth mask regions 41, 42, 43 and 44. In example embodiments, each of the first and second mask regions 41 and 42 may define a first pattern A, and each of the third and fourth mask regions 43 and 44 may define a second pattern B. The first and second patterns A and B may compose a desired pattern of at least one chip region. Each of the first and third mask regions 41 and 43 may define the first pattern A, and each of the second and fourth mask regions 42 and 44 may define the second pattern B. Furthermore, the first and second patterns A and B may be allotted to other combinations of the mask regions 41, 42, 43 and 44, whereas each of the patterns A and B may be allotted to two mask regions.

Referring to 5B, a fourth photomask 50 may include divided, e.g., equally divided, first, second, third and fourth mask regions 51, 52, 53 and 54. In example embodiments, each of the first, second, third and fourth mask regions 51, 52, 53 and 54, may define respective first, second, third and fourth patterns A, B, C, and D. The first, second, third and fourth patterns A, B, C and D, may compose a desired pattern of at least one chip region. When four chip regions are exposed to light by a single shot, the four mask regions 51, 52, 53 and 54, may define the patterns A, B, C, and D, respectively, and each mask regions 51, 52, 53 and 54, may correspond to one of four chip regions.

Referring to FIGS. 5A and 5B, the third photomask 40 may include four mask regions 41, 42, 43 and 44, each of which may define one of the two patterns A and B composing a desired pattern. The fourth photomask 50 may include four mask regions 51, 52, 53 and 54, each of which may define one of the four patterns A, B, C and D composing a desired pattern. That is, a desired pattern in one chip region may be divided into even number, e.g., two, four, six, eight, etc., of sub-patterns, and the sub-patterns may be allotted to a plurality of respective mask regions of a photomask. For example, the number of the mask regions may be the same as or a multiple of the number of the sub-patterns. That is, the sub-patterns and the mask regions may correspond to each other in one-to-one fashion or in one-to-multi fashion. The number of the sub-patterns may be limited by the number of chip regions exposable to light by a single shot.

Referring to FIG. 6A, the substrate 60 may include a plurality of chip regions 65 having substantially the same size, e.g., the same width in a second direction. Four of the chip regions 65 of the substrate 60 may be exposed to light by a single shot using, e.g., the third photomask 40 in FIG. 5A including the first and second mask regions 41 and 42 defining the first pattern A and the third and fourth mask regions 43 and 44 defining the second pattern B. In an exemplary embodiment, the first pattern A may be transferred to two of the four chip regions 65, and the second pattern B may be transferred to the other two of the four chip regions by a single shot of light. A stage (not shown) supporting the substrate 60 may be shifted in the second direction by a single shot width, e.g., by a total width of the two chip regions, and four chip regions 65 of the substrate 60 may be exposed to light. Shifting of the stage, e.g., to the second direction and to a third direction substantially perpendicular to the second direction, may be repeatedly performed to complete a first exposure process, so that all chip regions 65 may be exposed to light. The first pattern A or the second pattern B, which is a portion of a desired pattern of a chip region, may be transferred to each of the chip regions 65 in the first exposure process.

The substrate 60 and a photomask, e.g., the third photomask 40, may be aligned so that the first pattern A may overlap the chip regions 65 to which the second pattern B has already been transferred in the first exposure process. The third photomask 40 may be aligned by shifting the stage in the second direction and/or by shifting the third photomask 40 in the reverse direction of the second direction by half of the single shot width in the second direction, e.g., by the width of one chip region).

Four of the chip regions 65 of the substrate 60 may be exposed to light, e.g., by a single shot using the third photomask 40. Thus, the first pattern A may be transferred to two of the four chip regions 65 to which the second pattern B has already been transferred in the first exposure process, and the second pattern B may be transferred to the other two of the four chip regions 65 to which the first pattern A has already been transferred in the first exposure process by, e.g., a single shot of light. The stage may be shifted in the second direction by the single shot width, e.g., by the total width of the two chip regions, and other chip regions 65 of the substrate 60 may be exposed to light. Shifting of the stage to the second and third directions and the exposure of chip regions 65 may be repeatedly performed to complete a second exposure process.

Alternatively, after the first pattern A may be transferred to two of the chip regions 65 and the second pattern B may be transferred to the other two of the chip regions 65 by a single shot, the chip regions 65 of the substrate 60 may be exposed to light by shifting the stage and/or the third photomask 40 by half of a single shot width in the second direction and/or in the reverse direction of the second direction. Shifting of the stage to the second and third directions and the exposure of the chip regions 65 may be repeatedly performed to complete an exposure process.

Referring to FIG. 6B, four of the chip regions 65 of the substrate 60 may be exposed to light by a single shot using the fourth photomask 50 that includes the four mask regions 51, 52, 53, and 54, defining four patterns A, B, C and D, respectively. The first pattern A, the second pattern B, the third pattern C, and the fourth pattern D may be transferred to the respective four chip regions by a single shot. The fourth photomask 50 may include more than four mask regions defining an equal number of patterns.

The stage (not shown) supporting the substrate 60 may be shifted in the second direction by a single shot width, e.g., by a total width of the two chip regions, and four chip regions 65 of the substrate 60 may be exposed to light. Shifting of the stage to the third and second directions and the exposure of the chip regions 65 may be repeatedly performed to complete a first exposure process. The first pattern A, the second pattern B, the third pattern C, or the fourth pattern D, which may be a portion of a desired pattern of a chip region, may be transferred to each of the chip regions 65 in the first exposure process.

The substrate 60 and the fourth photomask 50 may be realigned so that the first pattern A may overlap the chip region 65 to which the second pattern B has already been transferred in the first exposure process. The fourth photomask 50 may be aligned by shifting the stage in the second direction and/or by shifting the fourth photomask 40 in the reverse direction of the second direction, by half of the single shot width in the second direction, e.g., by the width of one chip region.

Four of the chip regions 65 of the substrate 60 may be exposed to light by, e.g., a single shot using the fourth photomask 50. Thus, the first pattern A may be transferred to one chip region of the four chip regions 65 to which the second pattern B has already been transferred in the first exposure process, the second pattern B may be transferred to one chip region of the four chip regions 65 to which the first pattern A has already been transferred in the first exposure process, the third pattern C may be transferred to one chip region of the four chip regions 65 to which the fourth pattern D has already been transferred in the first exposure process, and the fourth pattern D may be transferred to one chip region of the four chip regions 65 to which the third pattern C has already been transferred in the first exposure process by the single shot of light. The stage may be shifted in the second direction by the single shot width, e.g., by the total width of the two chip regions, and other chip regions 65 of the substrate 60 may be exposed to light. Shifting of the stage to the third and second directions and the exposure of chip regions 65 may be repeatedly performed to complete a second exposure process.

The substrate 60 and the fourth photomask 50 may be aligned so that the first pattern A may overlap the chip region 65 to which the third and fourth patterns C and D have already been transferred in the first and second exposure processes. The fourth photomask 50 may be aligned by shifting the stage in the third direction and/or by shifting the fourth photomask 50 in the reverse direction of the third direction by half of the single shot width in the third direction e.g., by the width of one chip region.

Four of the chip regions 65 of the substrate 60 may be exposed to light by a single shot using the fourth photomask 50, so that the first pattern A may be transferred to one chip region of the four chip regions 65 to which the third and fourth patterns C and D have already been transferred in the first and second exposure processes, respectively, the second pattern B may be transferred to one chip region of the four chip regions 65 to which the third and fourth patterns C and D have already been transferred in the second and first exposure processes, respectively, the third pattern C may be transferred to one chip region of the four chip regions 65 to which the first and second patterns A and B have already been transferred in the second and first exposure processes, respectively, and the fourth pattern D may be transferred to one chip region of the four chip regions 65 to which the first and second patterns A and B have already been transferred in the first and second exposure processes, respectively, by the single shot of light. The stage may be shifted in the second direction by the single shot width, e.g., by the total width of the two chip regions, and other chip regions 65 of the substrate 60 may be exposed to light. Shifting of the stage to the third and second directions and the exposure of chip regions 65 may be repeatedly performed to complete a third exposure process.

Similarly, a fourth exposure process may be performed, so that each of the chip regions 65 may have a desired pattern including the first pattern A, the second pattern B, the third pattern C, and the fourth pattern D.

In the methods of exposing a substrate to light in accordance with example embodiments, only one photomask may be used instead of two photomasks in the conventional double patterning method. Thus, the methods may have an improved efficiency and reliability. Methods that use at least two photomasks, e.g., double patterning, may include advantages, such as an increased pattern density and a reduced line width by dividing patterns into one photomask and exposing twice using the same.

FIGS. 7A to 7E illustrate cross-sectional views of a method of forming a pattern in accordance with example embodiments.

Figure 7A:
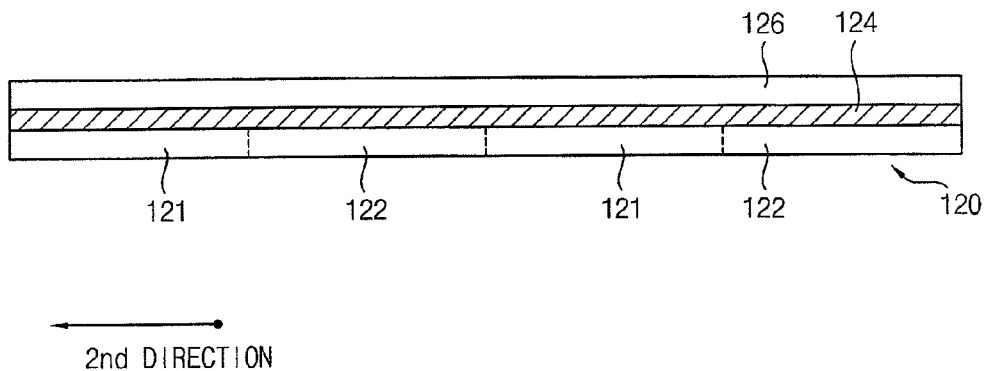
FIGS. 7A to 7E illustrate cross-sectional views of a method of forming a pattern according to an exemplary embodiment.

Referring to FIG. 7A, an object layer 124 and a first photosensitive layer 126 may be formed sequentially on a substrate 120 including first regions 121 and second regions 122 alternately formed therein. The first and second regions 121 and 122 may have substantially the same size, e.g., the same width in a second direction, and may include at least one chip region.

Figure 7B:
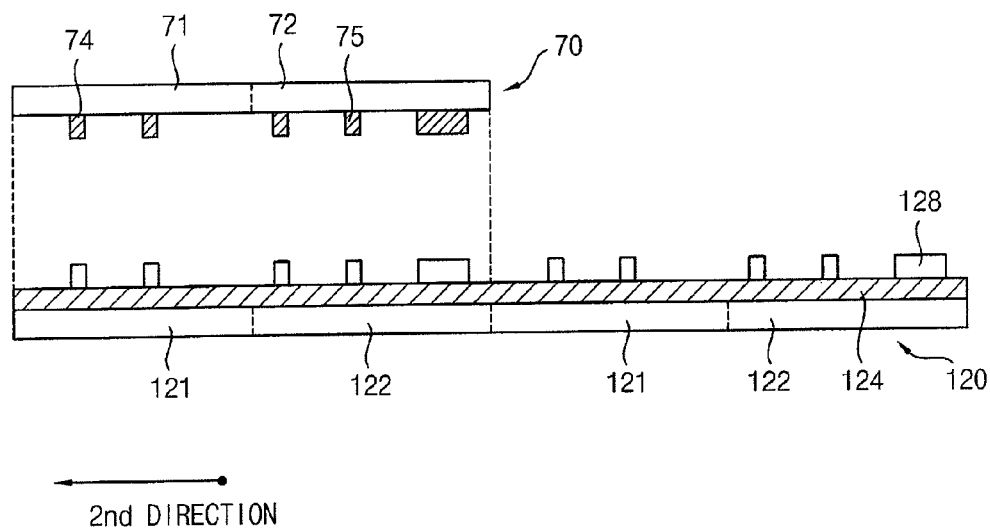

Referring to FIG. 7B, the first photosensitive layer 126 may be exposed to light using a fifth photomask 70 including a first mask region 71 and a second mask region 72. The first mask region 71 may have a first mask pattern 74 thereon, and the second mask region 72 may have a second mask pattern 75 thereon. Thus, the first mask pattern 74 and the second mask pattern 75 may be transferred to portions of the first photosensitive layer 126 over the first region 121 and the second region 122, respectively. The substrate 120 may be shifted in the second direction and/or the fifth photomask 70 may be shifted in the reverse direction of the second direction, by a single shot width in the second direction, and the remaining first photosensitive layer 126 may be exposed to light again. The shifting of the substrate 120 and the exposure of the first photosensitive layer 126 may be repeatedly performed until the whole portion of the first photosensitive layer 126 may be exposed. A first developing process may be performed on the first photosensitive layer 126 to form a first photosensitive layer pattern 128 on the object layer 124.

Figure 7C:
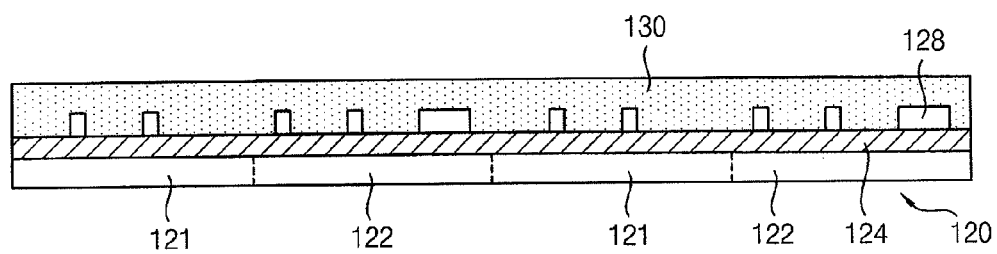

Referring to FIG. 7C, a second photosensitive layer 130 may be formed on the object layer 124 to cover the first photosensitive layer pattern 128.

Figure 7D:
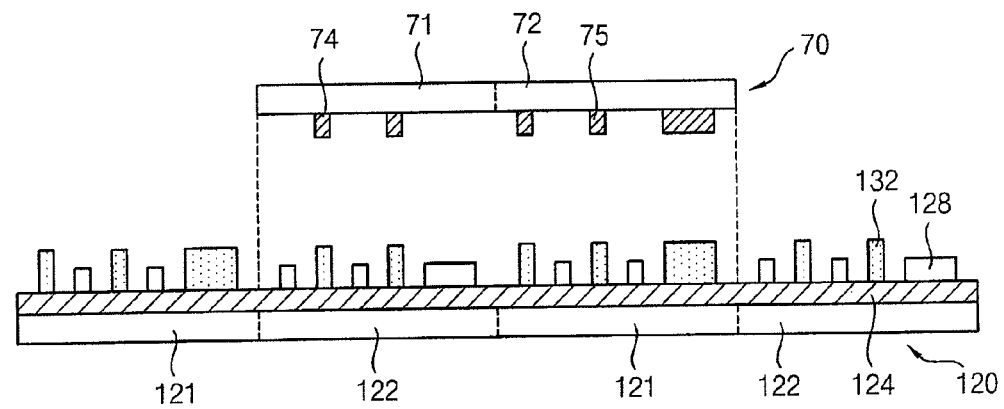

Referring to FIG. 7D, the fifth photomask 70 may be aligned with the substrate 120 so that the first mask region 71 of the fifth photomask 70 may overlap the second region 122 of the substrate 120 over which the second mask pattern 75 has previously been transferred, and the second mask region 72 may overlap the first region 121 of the substrate 120 over which the first mask pattern 74 has previously been transferred. The fifth photomask 70 may be aligned with the substrate 120 by shifting the substrate 120 by half of the single shot width in the second direction, and the second photosensitive layer 130 may be exposed to light.

Thus, the first mask pattern 74 may be transferred to the second photosensitive layer 130 over the second region 122 of the substrate 120, and the second mask pattern 75 may be transferred to the second photosensitive layer 130 over the first region 121. The substrate 120 may be shifted in the second direction and/or the fifth photomask 70 may be shifted in the reverse direction of the second direction, by the single shot width in the second direction, and the remaining second photosensitive layer 130 may be exposed to light again. Shifting of the substrate 120 and the exposure of the second photosensitive layer 130 may be repeatedly performed until the whole portion of the second photosensitive layer 130 may be exposed. A second developing process may be performed on the second photosensitive layer 130 to form a second photosensitive layer pattern 132 on the object layer 124.

Figure 7E:
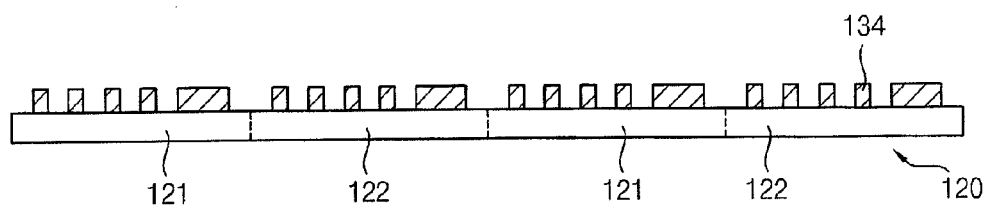

Referring to FIG. 7E, the object layer 124 may be etched using the first and second photosensitive layer patterns 128 and 132 as etching masks. Thus, an object layer pattern 134 may be formed on the substrate 120. Both of the first mask pattern 74 and the second mask pattern 75 may be transferred to each of the first region 121 and the second region 122.

FIGS. 8A to 8D illustrate cross-sectional views of a method of forming a pattern in accordance with example embodiments.

Figure 8A:
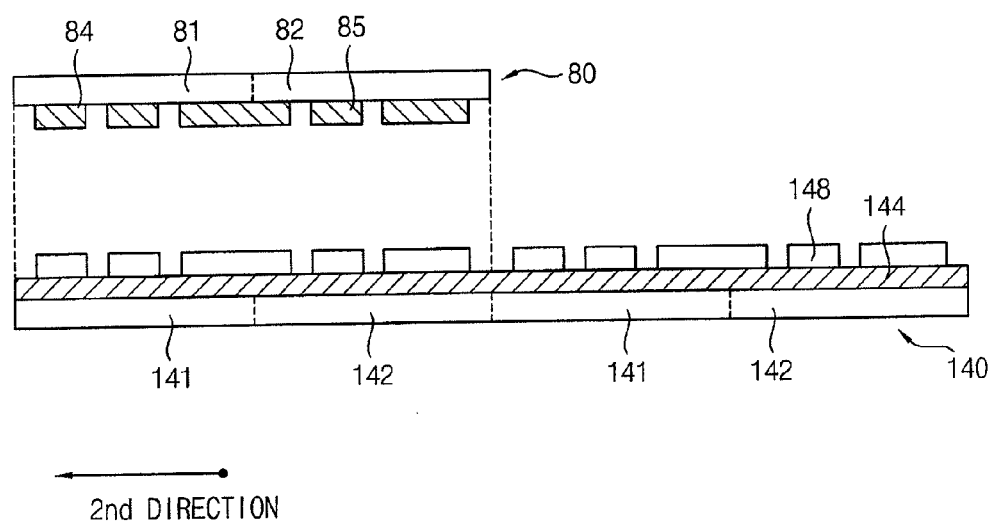
FIGS. 8A to 8D illustrate cross-sectional views of a method of forming a pattern in according to an exemplary embodiment.

Referring to FIG. 8A, a first object layer 144 and a first photosensitive layer may be formed sequentially on a substrate 140, and a first photosensitive layer pattern 148 may be formed on the object layer 144 by performing a first exposure process and a first developing process.

According to an exemplary embodiment, the substrate 140 and a sixth photomask 80 may be aligned so that a first mask region 81 of the sixth photomask 80 may overlap a first region 141 of the substrate 140, and a second mask region 82 of the sixth photomask 80 may overlap a second region 142 of the substrate 140. A first mask pattern 84 and a second mask pattern 85 may be transferred to portions of the first photosensitive layer over the first region 141 and the second region 142, respectively. The substrate 140 may be shifted in a second direction and/or the sixth photomask 80 may be shifted in the reverse direction of the second direction, by a single shot width, and the remaining first photosensitive layer may be exposed to light again. The shifting of the substrate 140 and the exposure of the first photosensitive layer may be repeatedly performed until the whole portion of the first photosensitive layer may be exposed. The first developing process may be performed on the first photosensitive layer to form the first photosensitive layer pattern 148 on the object layer 144.

Figure 8B:
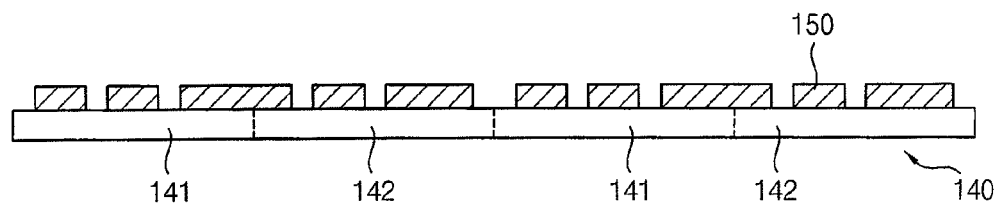

Referring to FIG. 8B, a first patterning process may be performed to partially remove the object layer 144 using the first photosensitive layer pattern 148 as an etching mask. Accordingly, a first object layer pattern 150 may be formed on the substrate 140. The first photosensitive layer pattern 148 may be removed from the substrate 140 after forming the first object layer pattern 150.

Figure 8C:
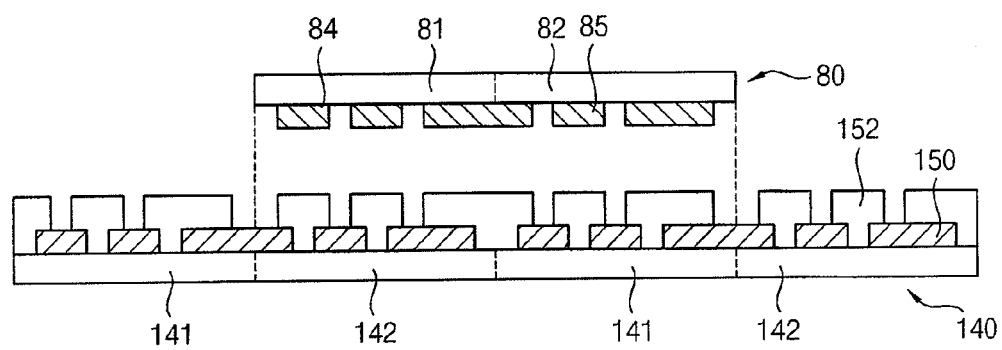

Referring to FIG. 8C, a second photosensitive layer may be formed on the substrate 140 to cover the first object layer pattern 150, and a second photosensitive layer pattern 152 may be formed on the substrate 140 by performing a second exposure process and a second developing process.

According to an exemplary embodiment, the sixth photomask 80 may be aligned with the substrate 140 so that the first mask region 81 may overlap the second region 142 of the substrate 140 and the second mask region 82 may overlap the first region 141 of the substrate 140. The sixth photomask 80 may be aligned with the substrate 140 by shifting the substrate 140 by, e.g., half of the single shot width in the second direction, and the second photosensitive layer may be exposed to light. Thus, the first mask pattern 84 may be transferred to the second photosensitive layer over the second region 142 of the substrate 140, and the second mask pattern 85 may be transferred to the second photosensitive layer over the first region 141. The substrate 140 may be shifted in the second direction and/or the sixth photomask 80 may be shifted in the reverse direction of the second direction, by the single shot width, and the remaining second photosensitive layer may be exposed to light again. Shifting of the substrate 140 and the exposure of the second photosensitive layer may be repeatedly performed until the whole portion of the second photosensitive layer may be exposed to light. A second developing process may be performed on the second photosensitive layer to form a second photosensitive layer pattern 152 on the substrate 140

Figure 8D:
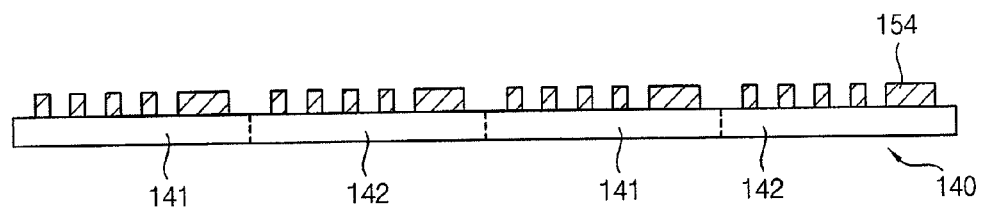

Referring to FIG. 8D, a second patterning may be performed to partially remove the first object layer pattern 150 using the second photosensitive layer pattern 152 as an etching mask. Thus, a second object layer pattern 154 may be formed on the substrate 140. The second photosensitive layer pattern 152 may be removed from the substrate 140 after forming the second object layer pattern 150.

According to an exemplary embodiment, a desired pattern may be divided into two and allotted to two mask regions of a photomask, and the desired pattern may be transferred from the photomask to an object layer. Alternatively, the desired pattern may be divided into n (n is an integer more than two) and allotted to n mask regions of a photomask, e.g. four, six, or eight, etc. that is an even number, and the desired pattern may be transferred from the photomask to an object layer.

In the case the desired pattern is divided into n, a photo-developing process and an etching process may be performed n times, and the n divided patterns allotted to the n mask regions of the photomask may be transferred to at least one chip region by performing the above processes n times. In an example embodiment, the photo-developing process may be performed by shifting a substrate on which the desired pattern may be formed by a single shot width until the entire object layer may be exposed.

FIGS. 9 to 13 illustrate cross-sectional views of a method of manufacturing a semiconductor memory device, e.g., a dynamic random access memory (DRAM) device, in accordance with example embodiments.

Figure 9:
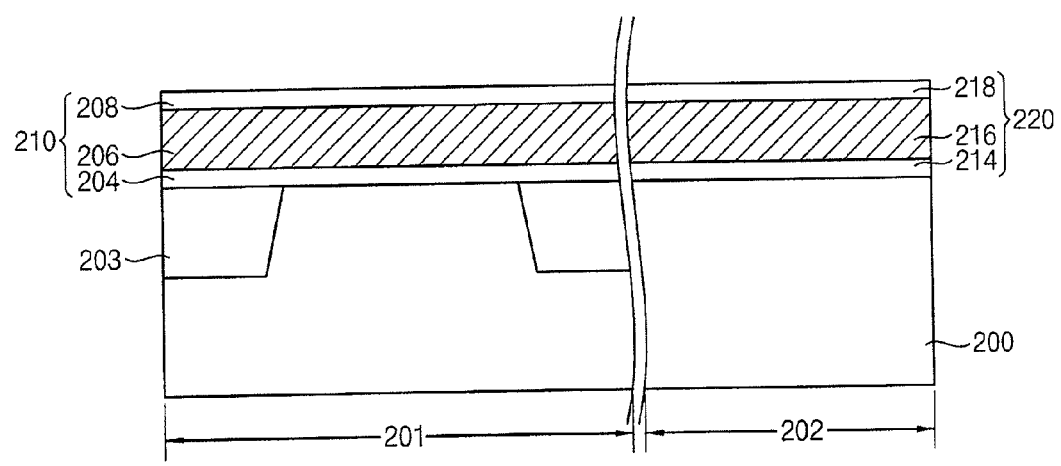

Referring to FIG. 9, a substrate 200 including a cell region 201 and a peripheral region 202 may be provided. An isolation layer 203 may be formed on the substrate 200 to define at least one active region. A first gate insulating layer 204, a first gate conductive layer 206, and a first gate mask layer 208, may be formed sequentially on the substrate 200 in the cell region 201 to form a first layer structure 210. A second gate insulating layer 214, a second gate conductive layer 216, and a second gate mask layer 218, may be formed sequentially on the substrate 200 in the peripheral region 202 to form a second layer structure 220. The first and second layer structures 210 and 220 may be formed in one process step, e.g., simultaneously formed.

A gate pattern in the cell region 201 may serve as a word line, and may be formed to have a relatively high density and a relatively small line width for the purpose of, e.g., a high integration degree. A gate pattern in the peripheral region 202 may be formed to have a relatively large line width for the purpose of, e.g., a low resistance and a rapid response. The first and second layer structures 210 and 220 may be patterned to form the gate patterns in the cell region 201 and the peripheral region 202, respectively, in accordance with example embodiments illustrated herein.

For example, a photomask may be equally divided into e.g., a first mask region and a second mask region, and a desired gate pattern may be divided into a corresponding number of mask patterns, e.g., a first mask pattern and a second mask pattern, and be allotted to a corresponding number of mask regions, e.g., the respective first and second mask regions. Each of the first and second mask regions may correspond to at least one chip region of the substrate 200. The first mask pattern allotted to the first mask region may be transferred to a first chip region, and the second mask pattern allotted to the second mask region may be transferred to a second chip region.

In an example embodiment, a first photosensitive layer (not shown) may be formed on the first and second layer structures 210 and 220, and a first exposure process may be performed on the substrate 200 on which the first photosensitive layer is formed. In the first exposure process, the first mask pattern in the first mask region may be transferred to the first photosensitive layer in the first chip region, and the second mask pattern in the second mask region may be transferred to the first photosensitive layer in the second chip region. A developing process may be performed on the first photosensitive layer to form a first photosensitive layer pattern (not shown). The first and second gate structures 210 and 220 may be partially removed using the first photosensitive layer pattern as an etching mask. Thus, a gate pattern including patterns in the first and second chip regions, which may have different shapes from each other, may be formed.

Figure 10A:
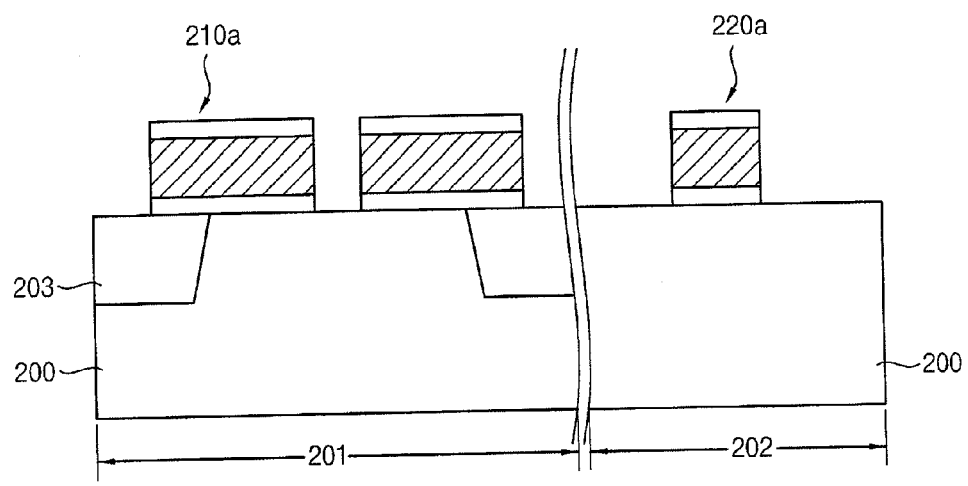
Figure 10B:
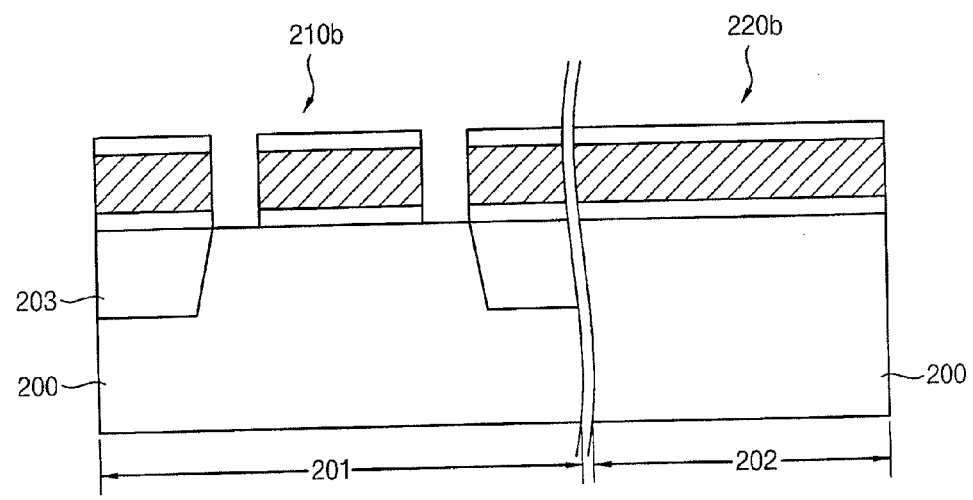

FIGS. 10A and 10B illustrate cross-sectional views of the above discussed gate pattern including the patterns formed in the first and second chip regions. First gate patterns 210*a* and 220*a* may be formed in, e.g., the first chip region, as illustrated in FIG. 10A, and second gate patterns 210*b* and 220*b* may be formed in, e.g., the second chip region, as illustrated in FIG. 10B. The first gate patterns 210*a* and 220*a* and the second gate patterns 210*b* and 220*b* may include some portions of a desired gate pattern that does not overlap each other. For example, the first gate pattern 210*a* and the second gate pattern 210*b* may include divided patterns for forming a word line having a small line width.

A second photosensitive layer (not shown) may be formed on the substrate 200 on which the first gate patterns 210*a* and 220*a* and the second gate patterns 210*b* and 220*b* are formed, and a second exposure process may be performed using the photomask including the first mask region and the second mask region. In the second exposure process, the photomask may be aligned with the substrate 200 by shifting a stage supporting the substrate 200 so that the first mask pattern in the first mask region may be transferred to the second photosensitive layer in the second chip region and the second mask pattern in the second mask region may be transferred to the second photosensitive layer in the first chip region. After performing the second exposure process, a developing process may be performed on the second photosensitive layer to form a second photosensitive layer pattern (not shown). The first gate patterns 210*a* and 220*a* in the first chip region and the second gate patterns 210*b* and 220*b* in the second chip region may be partially removed using the second photosensitive layer pattern as an etching mask.

Referring to FIG. 11, the first and second chip regions may include the patterns transferred from both of the first mask region and the second mask region by performing a photolithography process twice. Thus, third gate patterns 210*c* and 220*c* may be formed on the substrate 200.

Referring to FIG. 12, an insulation layer may be formed on the substrate 200 to cover the third gate patterns 210*c* and 220*c*. The insulation layer may be partially removed by, e.g., an anisotropic etching process, to form gate spacers 209 and 219 on sidewalls of the third gate patterns 210*c* and 220*c*, respectively. Source and drain regions 211, 212, and 221 may be formed, e.g., by an ion implanting process, at upper portions of the substrate 200 adjacent to one of the third gate patterns 210*c* and 220*c*. Thus, a word line of a DRAM device may be formed in the cell region 201, and a transistor of an electric circuit may be formed in the peripheral region 202.

Figure 13:
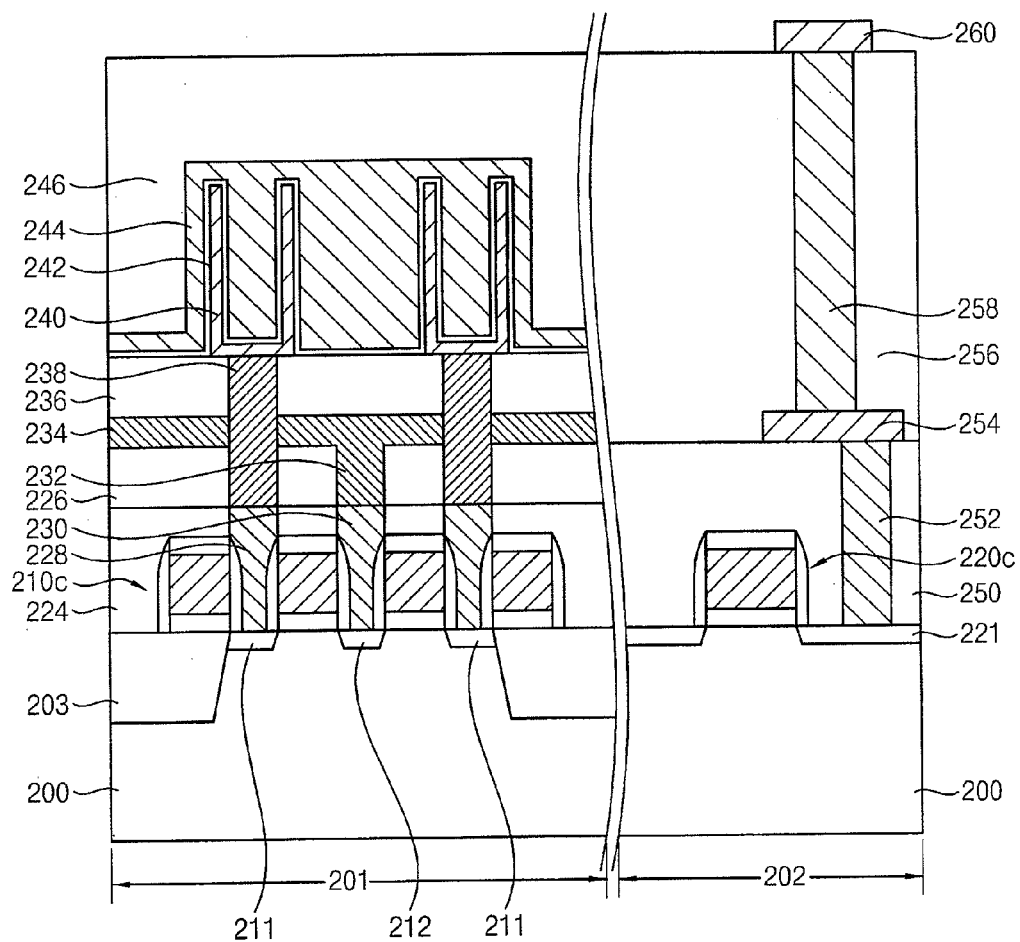

Referring to FIG. 13, a first insulating interlayer 224 may be formed on the substrate 200 to cover the word line in the cell region 201. The first insulating interlayer 224 may be partially removed to form a first opening (not shown), and the first opening may be filled with a conducting material to form first pads 228 and 230 connected to the respective source/drain regions 211 and 212. A second insulating interlayer 226 may be formed on the first pads 228 and 230 and the first insulating interlayer 224. The second insulating interlayer 226 may be partially removed to form a first hall (not shown) exposing the first pad 230. A conductive layer may be formed on the first pad 230 and the second insulating interlayer 226 to fill the first hall, and may be patterned to form a bit line 234 and a bit line contact 232. The bit line 234 may be formed by a method substantially the same as the above methods of forming a pattern in accordance with example embodiments.

A third insulating interlayer 236 may be formed on the second insulating interlayer 226 to cover the bit line 234. The second and third insulating interlayers 226 and 236 may be partially removed to form a second hall (not shown) exposing the first pad 228, and the second hall may be filled with a conducting material to form a capacitor contact plug 238. A lower electrode 240, a dielectric layer 242, and an upper electrode 244, may be sequentially formed on the third insulating interlayer 236 to be electrically contacted to the capacitor contact plug 238. An insulating layer 246 may be formed to cover the upper electrode 244. The lower electrode 240, the dielectric layer 242, and the upper electrode 244, may form a capacitor.

A wiring for, e.g., applying an electrical signal to the transistor may be formed in the peripheral region 202. According to an exemplary embodiment, a fourth insulating interlayer 250 may be formed on the substrate 200 to cover the transistor, and then partially removed to form a second opening (not shown) exposing at least one source/drain region 221. A second pad 252 may be formed to fill the second opening with a conducting material. A third pad 254 may be formed on the fourth insulating interlayer 250 to be electrically connected to, e.g., the second pad 252. A fifth insulating interlayer 256 may be formed on the fourth insulating interlayer 250 to cover the third pad 254. A fourth pad 258 may be formed through the fifth insulating interlayer 256 to be electrically connected to, e.g., the third pad 254. A conductive line 260 may be formed on the fifth insulating interlayer 256 to be electrically connected to, e.g., the fourth pad 258.

FIGS. 14 to 17 illustrate cross-sectional views of a method of manufacturing a semiconductor device, e.g., a flash memory device, in accordance with example embodiments.

Figure 14:
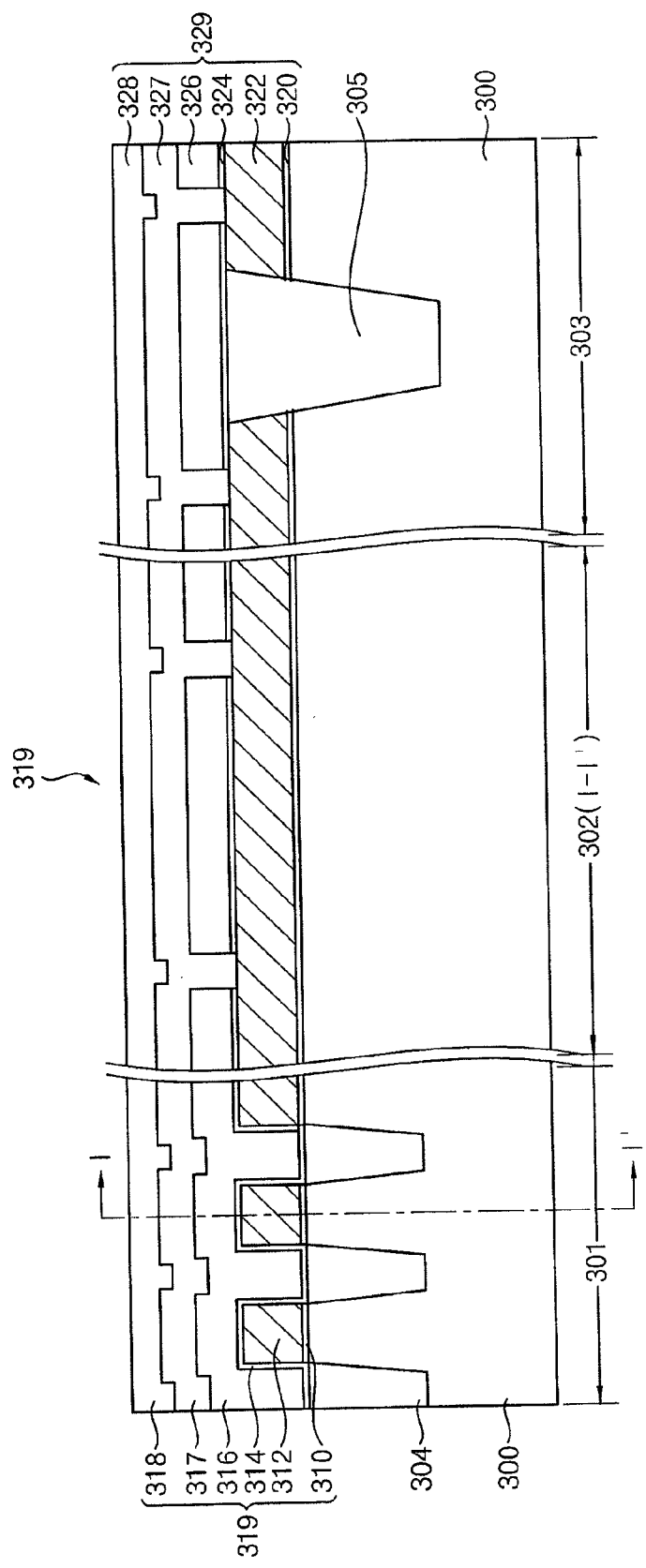
FIGS. 14 to 17 illustrate cross-sectional views of a method of manufacturing a semiconductor memory device in according to an exemplary embodiment.

Referring to FIG. 14, isolation layers 304 and 305 may be formed on a substrate 300 including cell regions 301 and 302, and a peripheral region 303. A tunnel insulation layer 310, a floating gate layer 312, a dielectric layer 314, control gate layers 316 and 317, and a mask layer 318 may be sequentially formed on the substrate 300 in the cell regions 301 and 302 to form a first layer structure 319 for, e.g., a word line. In the cell region 302, i.e., a cross-section taken along the line I-I', portions of the dielectric layer 314 and the control gate layer 316 for forming a source selection line (SSL) may be partially removed so that the floating gate layer 312 and the control gate layer 317 may be electrically connected to each other.

In the peripheral region 303, a gate insulating layer 320, a first gate layer 322, a dielectric layer 324, a second gate layer 326, a third gate layer 327, and a mask layer 328 may be sequentially formed on the substrate 300 to form a second layer structure 329 for, e.g., a gate pattern. Portions of the dielectric layer 324 and the second gate layer 326 for forming the gate pattern may be partially removed so that the first gate layer 322 and the third gate layer 327 may be electrically connected to each other.

In the cell regions 301 and 302, word line patterns having a relatively high density and a relatively small line width may be formed for the purpose of, e.g., a high integration degree. The gate pattern in the peripheral region 303 may be formed to have a relatively large line width for the purpose of, e.g., a low resistance and a rapid response. The word line patterns in the cell regions 301 and 302 and the gate pattern in the peripheral region 303 may be formed by a method substantially the same as the above methods of forming a pattern in accordance with exemplary embodiments.

For example, a photomask may be equally divided into a first mask region and a second mask region, and a desired gate pattern may be divided into two, i.e., a first mask pattern and a second mask pattern, and be allotted to the first and the second mask regions, respectively. Each of the first and second mask regions may correspond to at least one chip region of the substrate 300. The first mask pattern allotted to the first mask region may be transferred to a first chip region, and the second mask pattern allotted to the second mask region may be transferred to a second chip region According to an exemplary embodiment, a first photosensitive layer (not shown) may be formed on the first and second layer structures 319 and 329 for the respective word line and the gate pattern, and a first exposure process may be performed on the substrate 300 on which the first photosensitive layer is formed. In the first exposure process, the first mask pattern in the first mask region may be transferred to the first photosensitive layer in the first chip region, and the second mask pattern in the second mask region may be transferred to the first photosensitive layer in the second chip region. A developing process may be performed on the first photosensitive layer to form a first photosensitive layer pattern (not shown). The first and second layer structures 319 and 329 may be partially removed using the first photosensitive layer pattern as an etching mask. Thus, a gate pattern including patterns in the first and second chip regions, which may have different shapes from each other, may be formed.

Figure 15A:
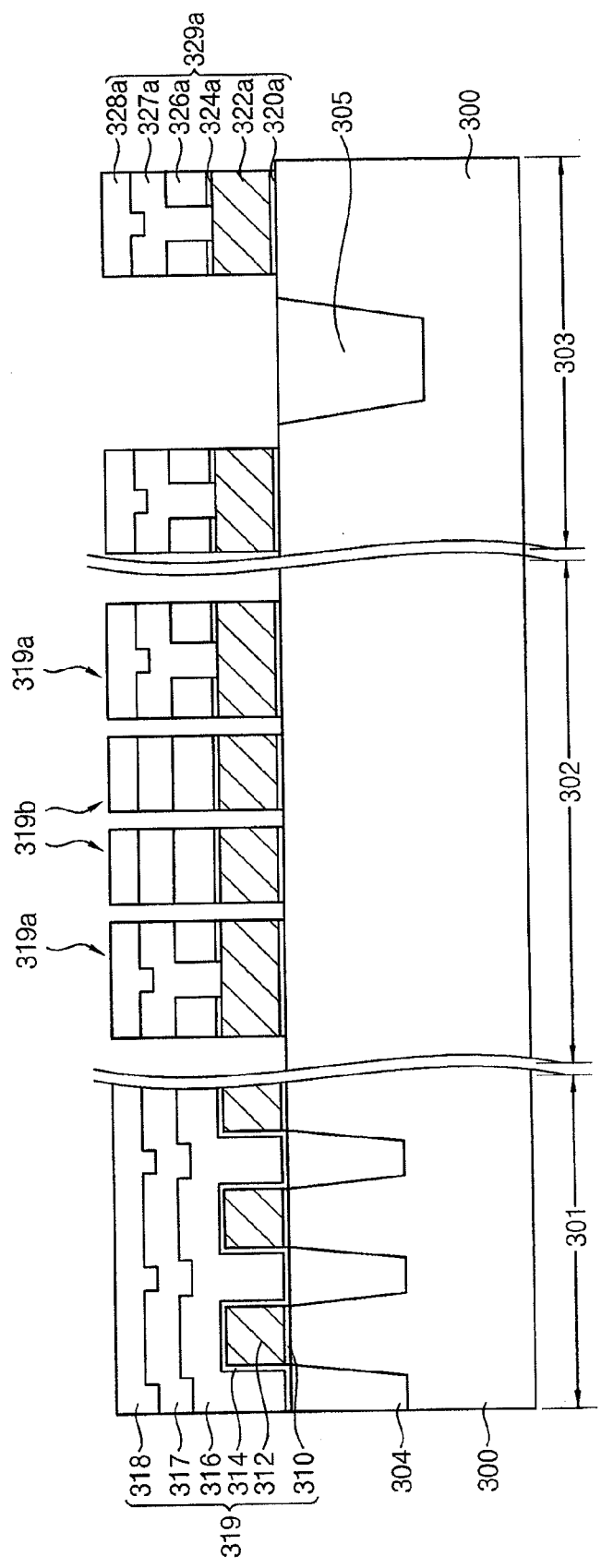

FIGS. 15A and 15B illustrate cross-sectional views of gate patterns that may be formed in different chip regions. First pattern structures 319a, 319b, and 329a, may be formed in the first chip region as illustrated in FIG. 15A. second pattern structures 319c, 319d, and 329b may be formed in the second chip region as illustrated in FIG. 15B.

A second photosensitive layer (not shown) may be formed on the substrate 300 to cover the first pattern structures 319a, 319b, and 329a, and the second pattern structures 319c, 319d, and 329b. A second exposure process may be performed on the second photosensitive layer using the photomask including the first mask region and the second mask region. In the second exposure process, the photomask may be aligned with substrate 300 by, e.g., shifting a stage supporting the substrate 300, so that the first patterns in the first mask region may be transferred to the second photosensitive layer in the second chip region, and the second patterns in the second mask region may be transferred to the second photosensitive layer in the first chip region. A developing process may be performed on the second photosensitive layer to form a second photosensitive layer pattern (not shown). The first pattern structures 319a, 319b, and 329a, and the second pattern structures 319c, 319d, and 329b, may be partially removed using the second photosensitive layer pattern as an etching mask.

Figure 16:
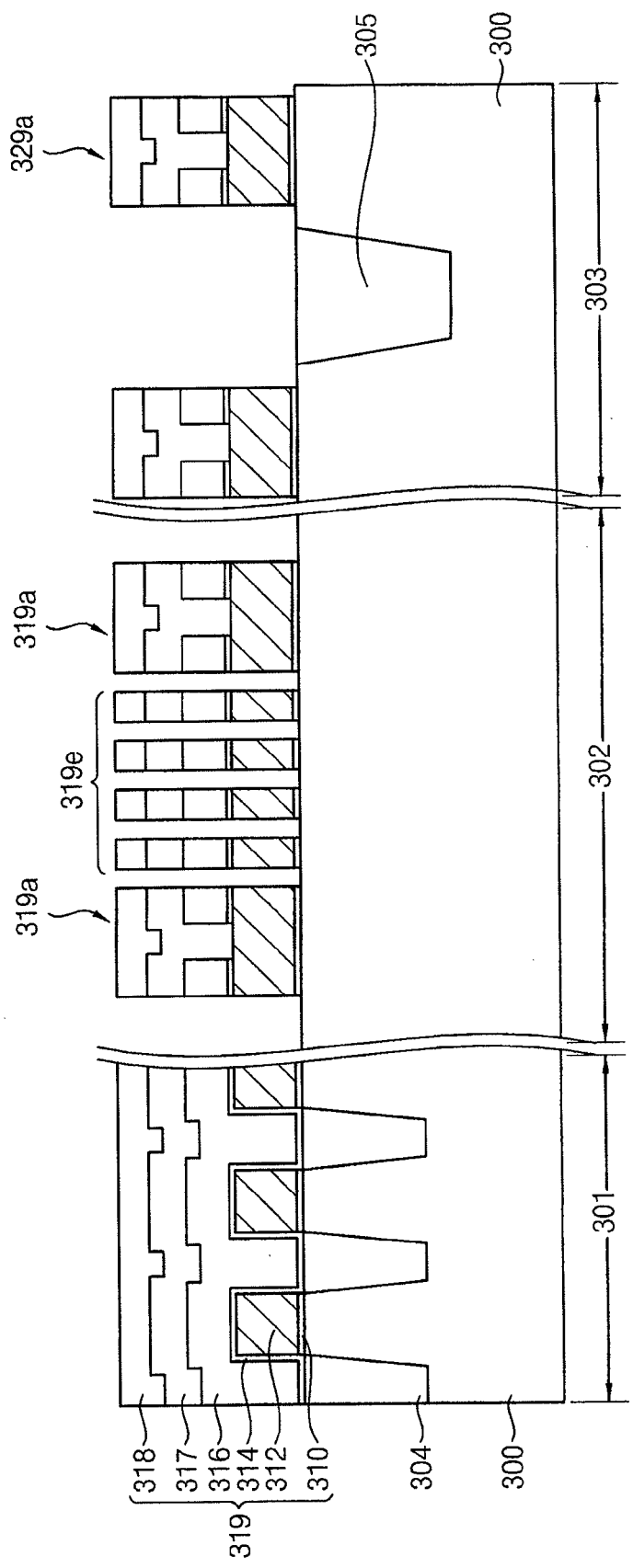

Referring to FIG. 16, the first and second chip regions may include the patterns transferred from both of the first mask region and the second mask region by performing a photolithography process twice. Thus, the third pattern structures 319a, 319e, and 329a, may be formed on the substrate 300. Some of the third pattern structures 319a formed in the cell regions 301 and 302 may correspond to a source selection line (SSL), and other structures 319e may correspond to a word line in a flash memory device.

Figure 17:
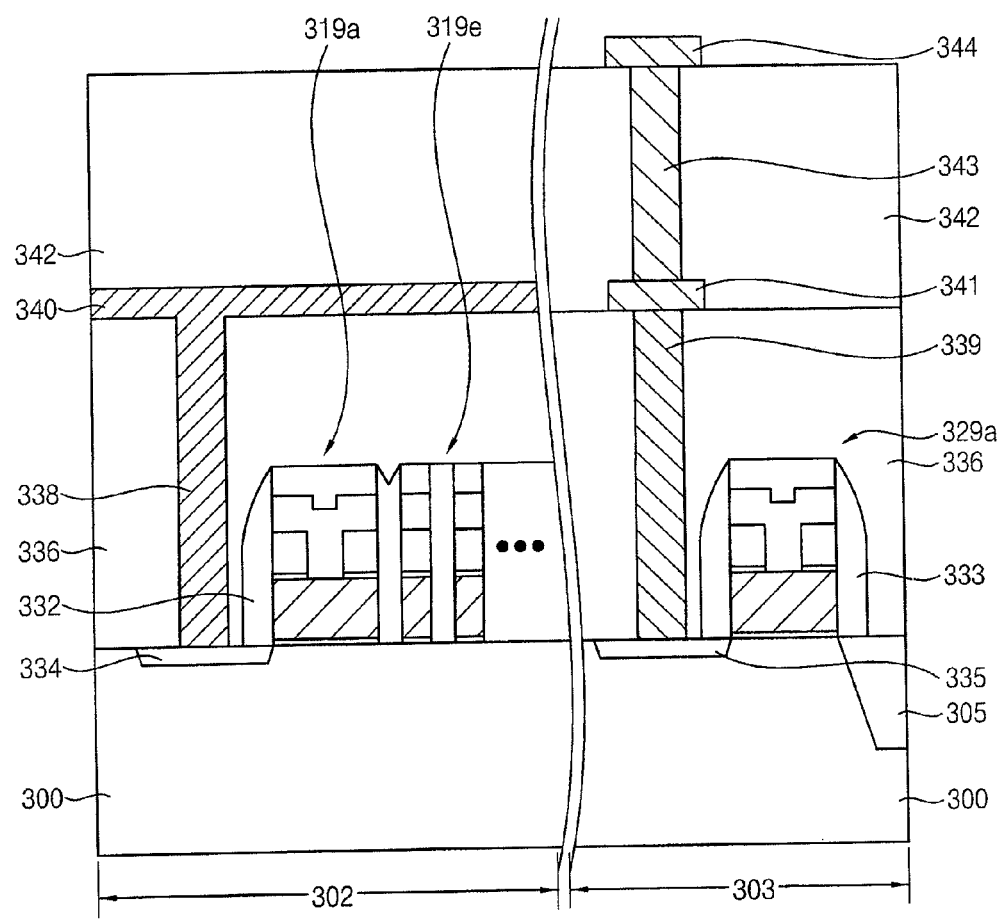

Referring to FIG. 17, an insulation layer may be formed on the substrate 300 to cover the third pattern structures 319a, 319e, and 329a. The insulation layer may be partially removed by an anisotropic etching process to form gate spacers 332 and 333 on sidewalls of the third pattern structures 319a, 319e, and 329a. Conductive regions 334 and 335 may be formed, e.g., by an ion implanting process, at upper portions of the substrate 300 adjacent to the third pattern structures 319a, 319e, and 329a. The conductive regions 334 and 335 may be source/drain regions.

In the cell region 302, a first insulating interlayer 336 may be formed to cover the third pattern structures 319a, 319e. The first insulating interlayer 336 may be partially removed to form a first opening (not shown), and the first opening may be filled with a conducting material to form a first pad 338 and a first conductive line 340. A second insulating interlayer 342 may be formed on the first conductive line 340. In the peripheral region 303, the first insulating interlayer 336 may be formed to cover the third pattern structures 329a. The first insulating interlayer 336 may be partially removed to form a second opening (not shown), and the second opening may be filled with a conducting material to form a second pad 339. A third pad 341 may be formed on the first insulating interlayer 336 to be electrically connected to the second pad 339. The second insulating interlayer 342 may be formed on the first insulating interlayer 336 to cover the third pad 341, and a fourth pad 343 may be formed therethrough to be electrically connected to the third pad 341. A second conductive line 344 may be formed on the second insulating interlayer 342 to be electrically connected to the fourth pad 343.

A dynamic random access memory (DRAM) device and a flash memory device may be manufactured using the methods of exposing a substrate to light and forming a pattern according to example embodiments. In addition, the methods may be applied to forming a fine pattern of a memory device such as a ferroelectric random access memory (FRAM) device, a magnetic random access memory (MRAM), a phase-change random access memory (PRAM), an integrated circuit device, a thin layer transistor, etc.

Various example embodiments will be described more fully hereinafter with reference to the accompanying drawings, in which some example embodiments are shown. The embodiments may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the team "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to example embodiments, patterns to be formed in one chip region may be divided into more than one mask regions of one photomask. By using one photomask, a problem of substitution and misalignment of photomasks which may be caused when two photomasks are used may be solved.

Moreover, a plurality of chip regions may be exposed to light by a single shot of light, and thus, the photomask may be aligned easily using alignment marks formed by a chip unit. Additionally, patterns divided into more than one mask regions may be transferred to one chip region by performing exposure processes sequentially to improve a resolution and an accuracy of patterns.

The foregoing is illustrative of example embodiments and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims.

What is claimed is:

1. A method of forming a pattern, comprising:
    sequentially forming an object layer and a first photosensitive layer on a substrate including a plurality of first regions and a plurality of second regions alternately arranged therein;
    forming a first photosensitive layer pattern including a first pattern in one of the plurality of first regions and a second pattern in an adjacent one of the plurality of second regions by performing a first photolithography process using a photomask having a first mask region and a second mask region, the first pattern being transferred from the first mask region, and the second pattern being transferred from the second mask region;
    shifting the substrate or the photomask by a single shot width after forming the first photosensitive layer pattern, and transferring the first pattern to another one of the plurality of first regions and transferring the second pattern to another adjacent one of the plurality of second regions, the first pattern being transferred to each of the plurality of first regions and the second pattern being transferred in each of the plurality of second regions;
    performing a first etching process on the object layer using the first photosensitive layer pattern as an etching mask to form a first object layer pattern;
    forming a second photosensitive layer on the substrate to cover the first object layer pattern;
    forming a second photosensitive layer pattern including a third pattern in the adjacent one of the plurality of the second regions and a fourth pattern in the other one of the plurality of the first regions by performing a second photolithography process using the photomask, the third pattern being transferred from the first mask region, and the fourth pattern being transferred from the second mask region;
    before performing the second photolithography process, shifting the substrate or the photomask by half of the single shot width; and
    performing a second etching process on the first object layer pattern using the second photosensitive layer pattern as an etching mask to form a second object layer pattern.

2. The method as claimed in claim 1, wherein:
    the first and the second regions of the substrate include at least one chip region; and
    the first and the second regions of the substrate are arranged side by side in a first direction or in a second direction perpendicular to the first direction.

3. The method as claimed in claim 1, wherein a portion of the second pattern of the first photosensitive layer pattern does not overlap the third pattern of the second photosensitive layer pattern.

4. The method as claimed in claim 1, further comprising:
    aligning the photomask with the substrate after forming the second photosensitive layer so that the first mask region overlaps the second region of the substrate and the second mask region overlaps the first region of the substrate.

5. The method as claimed in claim 1, wherein:
    the first mask region and the second mask region define a pattern in a cell region of a semiconductor device; and
    at least one of the first mask region and the second mask region defines a pattern in a peripheral region of the semiconductor device.

6. The method as claimed in claim 5, wherein a word line or a bit line includes the pattern in the cell region include.

7. The method as claimed in claim 1, wherein the first mask region and the second mask region define patterns extending in the same direction, and the first and second mask regions are exposed to light simultaneously by a single source of light.

8. A method of forming a pattern, comprising:
    (a) forming an object layer on a substrate including a plurality of chip regions;
    (b) forming a photosensitive layer on the object layer;
    (c) forming a photosensitive layer pattern by performing a photo-developing process using a photomask, the photomask including n mask regions (n being an even number), the n mask regions defining n divided patterns from a desired pattern of one of the chip regions, respectively, and each n mask region corresponding to at least one of the chip regions;
    (d) forming an object layer pattern by performing an etching process using the photosensitive layer pattern as an etching mask; and
    (e) performing the steps of (b) to (d) n times,
    wherein the step (c) includes aligning the photomask with the substrate so that all the n divided patterns are transferred from the n masks regions to each of the chip regions once while the steps of (b) to (d) are repeated n times, and transferring the n mask regions to each of the chip regions during the n times repeated steps of (b) to (d) includes shifting the substrate or the photomask by a single shot width at least one time and shifting the substrate or the photomask by a half of the single shot width at least one time.

9. The method as claimed in claim 8, wherein the step (c) includes exposing the entire photosensitive layer to light by repeatedly shifting the substrate by the single shot width.

10. The method as claimed in claim 8, further comprising:
    (f) removing the photosensitive layer pattern from the substrate after forming the object layer pattern; and
    performing the steps of (b) to (f) n times.

* * * * *